United States Patent
Kim et al.

(10) Patent No.: US 12,126,910 B2
(45) Date of Patent: Oct. 22, 2024

(54) ELECTRONIC DEVICE INCLUDING IMAGE SENSOR AND OPERATING METHOD THEREOF

(71) Applicant: Samsung Electronics Co., Ltd., Suwon-si (KR)

(72) Inventors: Dongsoo Kim, Suwon-si (KR); Inah Moon, Suwon-si (KR); Jaehyoung Park, Suwon-si (KR); Shuichi Shimokawa, Suwon-si (KR); Kawang Kang, Suwon-si (KR); Yunjeong Kim, Suwon-si (KR); Jonghoon Won, Suwon-si (KR); Yeotak Youn, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/078,486

(22) Filed: Dec. 9, 2022

(65) Prior Publication Data
US 2023/0113058 A1    Apr. 13, 2023

Related U.S. Application Data

(63) Continuation of application No. PCT/KR2022/004218, filed on Mar. 25, 2022.

(30) Foreign Application Priority Data

Mar. 26, 2021    (KR) .................. 10-2021-0039741

(51) Int. Cl.
*H04N 23/69* (2023.01)
*H03M 1/18* (2006.01)

(52) U.S. Cl.
CPC .............. *H04N 23/69* (2023.01); *H03M 1/18* (2013.01)

(58) Field of Classification Search
CPC ...... H04N 23/69; H04N 25/51; H04N 25/575; H04N 25/59; H04N 23/667; H04N 23/71;
(Continued)

(56) References Cited

U.S. PATENT DOCUMENTS 6,567,022 B1 * 5/2003 Reuveni .............. H03M 1/1028
                                                                341/120
6,788,340 B1 * 9/2004 Chen .................... H04N 25/68
                                                                348/E5.073
(Continued)

FOREIGN PATENT DOCUMENTS

CN          112351193 A      2/2021
JP          2011-250039 A    12/2011
(Continued)

OTHER PUBLICATIONS

European Search Report dated Jan. 22, 2024, issued in European Application No. 22776147.5.

*Primary Examiner* — Chiawei Chen
(74) *Attorney, Agent, or Firm* — Jefferson IP Law, LLP

(57) ABSTRACT

An electronic device is provided. The electronic device includes an image sensor including a plurality of unit pixels, each unit pixel including two or more individual pixels, and at least one processor. The at least one processor is configured to acquire a first image frame from the image sensor, determine a photographing environment of the electronic device, based on the first image frame, and, in response to the photographing environment corresponding to a first photographing environment, control the image sensor to acquire analog data through the individual pixels, and provide first digital data digitally converted from the analog data with first sensitivity, and second digital data digitally converted from the analog data with second sensitivity which is higher than the first sensitivity, and acquire a
(Continued)

second image frame which follows the first image frame, based on the first digital data and the second digital data.

20 Claims, 18 Drawing Sheets

(58) Field of Classification Search
CPC ...... H04N 23/80; H04N 25/57; H04N 25/587; H04N 25/772; H04N 23/76; H04N 23/73; H04N 23/741; H04N 25/75; H03M 1/18; H03M 1/123; H03M 1/56

See application file for complete search history.

(56) References Cited

U.S. PATENT DOCUMENTS

| | | | |
|---|---|---|---|
| 9,819,890 B2* | 11/2017 | Wang | H04N 25/67 |
| 10,645,315 B2 | 5/2020 | Shim et al. | |
| 10,735,650 B2 | 8/2020 | Kinoshita | |
| 10,735,679 B2 | 8/2020 | Motonaga | |
| 10,841,517 B2 | 11/2020 | Totsuka | |
| 10,880,504 B2 | 12/2020 | Itano et al. | |
| 10,965,878 B2* | 3/2021 | Tatara | H04N 23/74 |
| 11,218,658 B2 | 1/2022 | Enoki | |
| 11,330,191 B2 | 5/2022 | Yokokawa et al. | |
| 2008/0239124 A1* | 10/2008 | Mori | H04N 25/677 |
| | | | 348/E3.018 |
| 2010/0002094 A1* | 1/2010 | Solhusvik | H04N 25/589 |
| | | | 348/230.1 |
| 2011/0037871 A1* | 2/2011 | Suzuki | H04N 25/75 |
| | | | 348/222.1 |
| 2012/0038809 A1* | 2/2012 | Lee | H04N 25/616 |
| | | | 348/308 |
| 2013/0228673 A1* | 9/2013 | Hashimoto | H04N 25/75 |
| | | | 250/208.1 |
| 2013/0329090 A1 | 12/2013 | Ise | |
| 2014/0263950 A1 | 9/2014 | Fenigstein et al. | |
| 2015/0062364 A1* | 3/2015 | Nakamura | H04N 25/75 |
| | | | 348/218.1 |
| 2015/0189210 A1 | 7/2015 | Shimizu | |
| 2015/0355443 A1 | 12/2015 | Okabe | |
| 2016/0219229 A1* | 7/2016 | Kimura | H04N 25/60 |
| 2018/0302578 A1* | 10/2018 | Ebihara | H01L 27/1255 |
| 2019/0158759 A1* | 5/2019 | Hatakeyama | H04N 23/815 |
| 2019/0295279 A1* | 9/2019 | Wang | H04N 23/74 |
| 2020/0068147 A1 | 2/2020 | Hayashi et al. | |
| 2020/0204751 A1* | 6/2020 | Lule | H04N 25/75 |
| 2020/0284575 A1 | 9/2020 | Yao et al. | |
| 2020/0366827 A1 | 11/2020 | Lee et al. | |
| 2022/0210358 A1* | 6/2022 | Young | H04N 25/75 |

FOREIGN PATENT DOCUMENTS

| | | |
|---|---|---|
| JP | 2012-120158 A | 6/2012 |
| JP | 2013-152334 A | 8/2013 |
| JP | 2015-128253 A | 7/2015 |
| JP | 6082274 B2 | 2/2017 |
| JP | 6282303 B2 | 2/2018 |
| JP | 6322058 B2 | 5/2018 |
| JP | 2019-068318 A | 4/2019 |
| JP | 2021-022921 A | 2/2021 |
| KR | 10-2018-0079519 A | 7/2018 |
| KR | 10-2020-0133167 A | 11/2020 |
| WO | 2019/220890 A1 | 11/2019 |
| WO | 2022/102972 A1 | 5/2022 |

* cited by examiner 1112  1114

1210

ELECTRONIC DEVICE INCLUDING IMAGE SENSOR AND OPERATING METHOD THEREOF

CROSS-REFERENCE TO RELATED APPLICATION(S)

This application is a continuation application, claiming priority under § 365(c), of an International application No. PCT/KR2022/004218, filed on Mar. 25, 2022, which is based on and claims the benefit of a Korean patent application number 10-2021-0039741, filed on Mar. 26, 2021, in the Korean Intellectual Property Office, the disclosure of which is incorporated by reference herein in its entirety.

TECHNICAL FIELD

The disclosure relates to technology for switching a photographing mode according to a photographing environment.

BACKGROUND ART

A dynamic range (DR) of a digital image is defined by a ratio between a brightest pixel value and a darkest pixel value in the image. A human's visual recognition system may deal with a higher DR than that of a normal digital camera or a monitor. Accordingly, an electronic device may have difficulty in acquiring or expressing an image recognized by human as it is.

An image having a larger DR than a DR that an electronic device normally deals with is referred to as a high dynamic range (HDR) image. The HDR image may have a wider DR than that of an image acquired by a normal digital camera.

HDR image generation technology may include multi frame high dynamic range (MF HDR) technology. The MF HDR technology refers to technology for extending a DR by acquiring a plurality of images corresponding to different exposure times, and combining them. The electronic device may acquire an HDR image based on a short-exposure image for a bright area and a long-exposure image for a dark area. For example, even when there is a big difference in brightness between areas in one image, an image of a large DR may be obtained by combining images of different exposure times.

The above information is presented as background information only to assist with an understanding of the disclosure. No determination has been made, and no assertion is made, as to whether any of the above might be applicable as prior art with regard to the disclosure.

DISCLOSURE OF INVENTION

Technical Problem

According to related-art technology, when a subject is moved while a plurality of images corresponding to different exposure times are acquired, a long-exposure image and a short-exposure image are not the same and thus an artifact may appear in a generated HDR image. For example, a ghost effect in which images of the moving subject overlap one another may occur.

Aspects of the disclosure are to address at least the above-mentioned problems and/or disadvantages and to provide at least the advantages described below. Accordingly, an aspect of the disclosure is to provide an electronic device including image sensor and operating method thereof.

Additional aspects will be set forth in part in the description which follows and, in part, will be apparent from the description, or may be learned by practice of the presented embodiments.

Solution to Problem

In accordance with an aspect of the disclosure, an electronic device is provided. The electronic device includes an image sensor including a plurality of unit pixels, each unit pixel including two or more individual pixels, and at least one processor electrically connected with the image sensor. The at least one processor may be configured to acquire a first image frame from the image sensor, determine whether a photographing environment of the electronic device corresponds to a designated photographing environment, based on the first image frame, in response to the photographing environment corresponding to a first photographing environment control the image sensor to acquire analog data through the individual pixels, and to provide first digital data digitally converted from the analog data with first sensitivity by the image sensor, and second digital data digitally converted from the analog data with second sensitivity which is higher than the first sensitivity, to the at least one processor, and acquire a second image frame which follows the first image frame, based on the first digital data and the second digital data, and, in response to the photographing environment corresponding to a second photographing environment control the image sensor to provide first image data which is acquired according to a first conversion gain, based on light quantity data inputted to the unit pixel, and second image data which is acquired according to a second conversion gain lower than the first conversion gain, based on the light quantity data, to the at least one processor, and acquire the second image frame based on the first image data and the second image data.

In accordance with another aspect of the disclosure, an electronic device is provided. The electronic device includes an image sensor including a plurality of pixels and at least one ADC, and at least one processor electrically connected with the image sensor. The at least one processor is configured to control the image sensor to acquire analog data through the pixels, and to provide first digital data which is digitally converted from the analog data with first sensitivity by the image sensor through the at least one ADC, and second digital data which is digitally converted from the analog data with second sensitivity higher than the first sensitivity through the at least one ADC, to the at least one processor, acquire the first digital data and the second digital data from the image sensor, acquire third digital data by adding first dummy data having a bit of a second number to the first digital data having a bit of a first number, acquire fourth digital data by adding second dummy data having the bit of the second number to the second digital data having the bit of the first number, and acquire the first image frame, based on the third digital data and the fourth digital data.

Advantageous Effects of Invention

According to various embodiments disclosed herein, an HDR image in which there are few artifacts (for example, a ghost phenomenon) included in the image and a DR is wide can be acquired.

According to various embodiments disclosed herein, an optimal photographing mode in which an optimal image can be acquired according to a photographing environment of an electronic device can be used. Accordingly, quality of an image that is obtained through the electronic device can be enhanced.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

BEST MODE FOR CARRYING OUT THE INVENTION

The following description with reference to the accompanying drawings is provided to assist in a comprehensive understanding of various embodiments of the disclosure as defined by the claims and their equivalents. It includes various specific details to assist in that understanding, but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used by the inventor to enable a clear and consistent understanding of the disclosure. Accordingly, it should be apparent to those skilled in the art that the following description of various embodiments of the disclosure is provided for illustration purposes only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
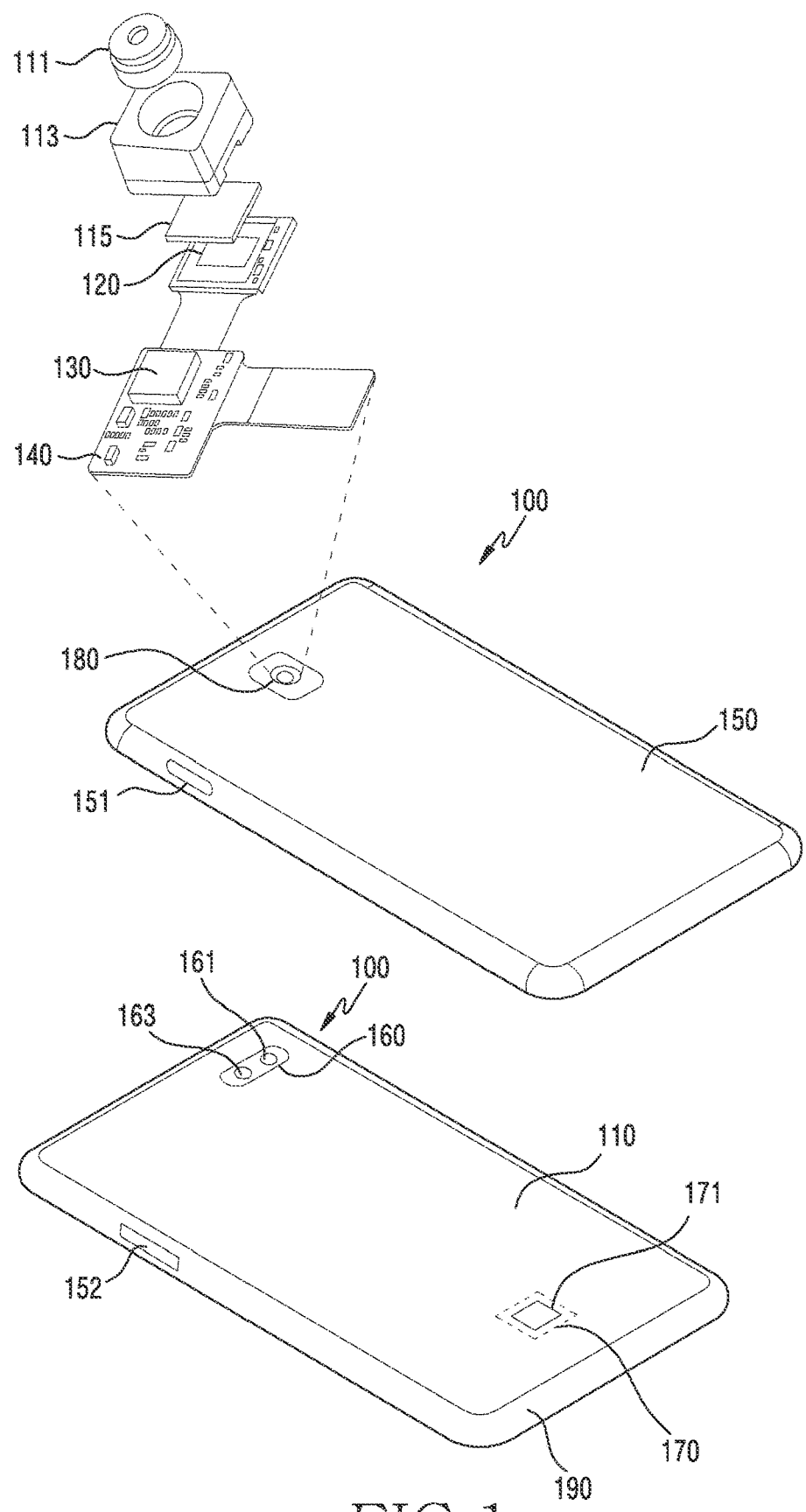
FIG. 1 is a view illustrating a structure related to an electronic device and a camera module according to an embodiment of the disclosure.

FIG. 1 illustrates a structure related to an electronic device 100 and a camera module 180 according to an embodiment of the disclosure.

FIG. 1 is a view schematically illustrating an exterior of the electronic device 100 having the camera module 180 mounted therein, and the camera module 180 according to an embodiment. The embodiment of FIG. 1 is illustrated and explained on the assumption of a mobile device, for example, a smartphone, but it will be clearly understood by those skilled in the art that the embodiment can be applied to an electronic device having a camera mounted therein among various electronic devices or mobile devices.

Referring to FIG. 1, a display 110 may be disposed on a front surface of the electronic device 100. The display 110 may occupy most of the front surface of the electronic device 100. The display 110 and a bezel 190 enclosing at least some edges of the display 110 may be disposed on the front surface of the electronic device 100. The display 110 may include a flat area and a curved area which is extended from the flat area toward a side surface of the electronic device 100. The electronic device 100 illustrated in FIG. 1 is one example and various embodiments are possible. For example, the display 110 of the electronic device 100 may include only a flat area without a curved area, or may include a curved area only on an edge of one side, not both sides. In an embodiment, the curved area may be extended to a rear surface of the electronic device 100, and the electronic device may include an additional flat area.

The electronic device 100 may additionally include a speaker, a receiver, a front-facing camera 161, a proximity sensor, and/or a home key. The electronic device 100 may have a rear surface cover 150 integrated into a main body of the electronic device. According to another embodiment, the rear surface cover 150 may have such a shape that the rear surface cover 150 can be separated from the main body of the electronic device 100 to allow a battery to be replaced. The rear surface cover 150 may be referred to as a battery cover or a back surface cover.

A fingerprint sensor 171 may be disposed in a first area 170 of the display 110 to recognize user's fingerprint. The fingerprint sensor 171 may be disposed on a lower layer of the display 110 so that the fingerprint sensor cannot be viewed by a user or is difficult to view. In addition, an additional sensor for user/biometric authentication may be disposed on some areas of the display 110 in addition to the fingerprint sensor 171. According to another embodiment, the sensor for user/biometric authentication may be disposed on a certain area of the bezel 190. For example, an infrared (IR) sensor for iris authentication may be disposed to be exposed through a certain area of the display 110, or to be exposed through a certain area of the bezel 190.

The front-facing camera 161 may be disposed in a second area 160 of the front surface of the electronic device 100. In the embodiment illustrated in FIG. 1, the front-facing camera 161 is exposed through a certain area of the display 110, but according to another embodiment, the front-facing camera 161 may be exposed through the bezel 190. According to another embodiment (not shown), the display 110 may include one or more of an audio module, a sensor module (e.g., a sensor 163), a camera module (e.g., the front-facing camera 161), and a light emitting element (not shown) on a back surface of the second area 160. For example, the camera module may be disposed on the front surface and/or the side surface of the electronic device 100 to face the front surface and/or the side surface. The front-facing camera 160 may be a under display camera (UDC) that is not visually exposed to the second area 160 and is hidden.

The electronic device 100 may include one or more front-facing cameras 161. For example, the electronic device 100 may include two front-facing cameras including a first front-facing camera and a second front-facing camera. According to an embodiment of the disclosure, the first front-facing camera and the second front-facing camera may be cameras of the same kind having the same specifications (e.g., pixels), but according to another embodiment, the first front-facing camera and the second front-facing camera may be implemented by cameras of different specifications. The electronic device 100 may support a function related to a dual camera (e.g., 3D photographing, auto focus, etc.) through the two front-facing cameras. The above-mentioned explanation of the front-facing camera may be applied to a rear-facing camera of the electronic device 100 equally or similarly.

The electronic device 100 may further include various hardware for assisting photographing, such as a flash or the sensor 163. For example, the electronic device 100 may include a distance sensor (for example, a TOF sensor) for detecting a distance between a subject and the electronic device 100. The distance sensor may be disposed separately from the front-facing camera 161 and/or the rear-facing camera, or may be disposed to be included in the front-facing camera 161 and/or the rear-facing camera.

At least one physical key may be disposed on a side surface of the electronic device 100. For example, a first function key 151 may be disposed on a right edge with reference to the front surface of the electronic device 100 to turn on/off the display 110 or to turn on/off power of the electronic device 100. A second function key 152 may be disposed on a left edge with reference to the front surface of the electronic device 100 to control a volume of the electronic device 100 or to control screen brightness. In addition, an additional button or key may be disposed on the front surface or rear surface of the electronic device 100. For example, a physical button or a touch button mapped onto a specific function may be disposed on a lower end area of the bezel 190 of the front surface.

The electronic device 100 illustrated in FIG. 1 is one example and does not limit to a shape of a device to which the technical concept of the disclosure is applied. For example, the technical concept of the disclosure can be applied to a foldable electronic device which is foldable in a horizontal direction or a vertical direction by employing a flexible display and a hinge structure, a rollable electronic device, or a tablet or a notebook computer.

Referring to FIG. 1, the electronic device 100 may include the camera module 180. The camera module 180 may include a lens assembly 111, a housing 113, an infrared cut filter 115, an image sensor 120, and an image signal processor (ISP) 130.

The lens assembly 111 may have different numbers of lenses, different arrangements, different types according to the front-facing camera 161 and the rear-facing camera. The front-facing camera 161 and the rear-surface camera may have different characteristics (e.g., a focal distance, a maximum magnification) according to a type of the lens assembly 111. The lens may move forward, backward according to an optical axis, and may operate to photograph a target object, which is a subject, clearly by changing a focal distance.

The camera module 180 may include a body tube having one or more lenses aligned on the optical axis and mounted therein, and the housing 113 having at least one coil and/or magnet mounted therein to enclose a circumference of the body tube with reference to the optical axis (not shown). The camera module 180 may perform a stabilization function (e.g., optical image stabilization (OIS)) of an image acquired through the image sensor 120, by using the at least one coil and/or magnet included in the housing 113. For example, the camera module 180 may control an electromagnetic force by controlling a direction and/or an intensity of a current passing through the at least one coil under control of a processor, and may move (or rotate) the lens assembly 111 and at least part of a lens carrier (not shown) including the lens assembly 111 in a direction substantially perpendicular to the optical axis (not shown), by using the Lorentz's force by the electromagnetic force.

The camera module 180 may use other methods for the image stabilization function. For example, the camera module 180 may use digital shake correction (video digital image stabilization (VDIS)). The camera module 180 may include a method of correcting a shaky image by performing software-level processing with respect to a data output value of the image sensor 120. For example, the camera module 180 may extract a motion vector based on a difference between frames of an image (different image) through digital shake correction (VDIS), and may increase sharpness through image processing. In addition, the camera module 180 may extract a motion vector based on an image through VDIS, and may recognize a motion of a subject as a shake, in addition to the shake of the electronic device 100.

The infrared cut filter 115 may be disposed on an upper surface of the image sensor 120. An image of a subject passing through the lens may be partially filtered by the infrared cut filter 115, and then, may be detected by the image sensor 120.

The image sensor 120 may be disposed on an upper surface of a printed circuit board 140 (for example, a printed circuit board (PCB), a printed board assembly (PBA), a flexible PCB (FPCB), or a rigid flexible PCB (RFPCB)). The image sensor 120 may be electrically connected with the image signal processor 130 connected with the printed circuit board 140 by a connector. The connector may use an FPCB or a cable.

The image sensor 120 may be a complementary metal oxide semiconductor (CMOS) sensor. A plurality of individual pixels may be integrated into the image sensor 120, and each individual pixel may include a micro lens, a color filter, and a photodiode (PD). Each individual pixel is a kind of light detector, and may convert incoming light into an electric signal. The light detector may include a photodiode. For example, the image sensor 120 may amplify a current which is generated from light received through the lens assembly 111 through the photoelectric effect of a light receiving element. For example, each individual pixel may include a photoelectric transformation element (or a position sensitive detector (PSD)), and a plurality of transistors.

Light information of a subject entering through the lens assembly 111 may be transformed into an electric signal by the image sensor 120 and may be inputted to the image signal processor 130.

When the image signal processor 130 and the image sensor 120 are physically separated, a sensor interface conforming to appropriate standards may electrically connect the image sensor 120 and the image signal processor 130.

The image signal processor 130 may perform image processing with respect to image data which is electrically transformed. The process at the image signal processor 130 may be divided into pre-ISP (hereinafter, pre-processing) and an ISP chain (hereinafter, referred to as post-processing). Image processing before demosaicking may refer to pre-processing, and image processing after demosaicking may refer to post-processing. The pre-processing process may include 3A processing, lens shading correction, edge enhancement, dead pixel correction, and knee correction. The 3A may include at least one of auto white balance (AWB), auto exposure (AE), auto focusing (AF). The post-processing process may include one of at least sensor index value change, tuning parameter change, aspect ratio adjustment. The post-processing process may include a process of processing image data outputted from the image sensor 120 or image data outputted from a scaler. The image signal processor 130 may adjust at least one of contrast, sharpness, saturation, dithering of an image through the post-processing process. The contrast, sharpness, saturation adjustment procedure may be executed in the YUV color space, and the dithering procedure may be executed in the red, green, blue (RGB) color space. A part of the pre-processing process may be performed in the post-processing process, or a part of the post-processing process may be performed in the pre-processing process. In addition, a part of the pre-processing process may overlap a part of the post-processing process.

The camera module 180 may be disposed not only on the rear surface of the electronic device 100, but also on the front surface. In addition, the electronic device 100 may include not only one camera module 180 but also a plurality of camera modules 180 to enhance performance of the camera. For example, the electronic device 100 may further include the front-facing camera 161 for making a video call or taking a self-photo. The front-facing camera 161 may support relatively low pixels compared to the rear-facing camera module. The front-facing camera 161 may have a relatively small size compared to the camera module 180 of the rear-facing camera.

Figure 2:
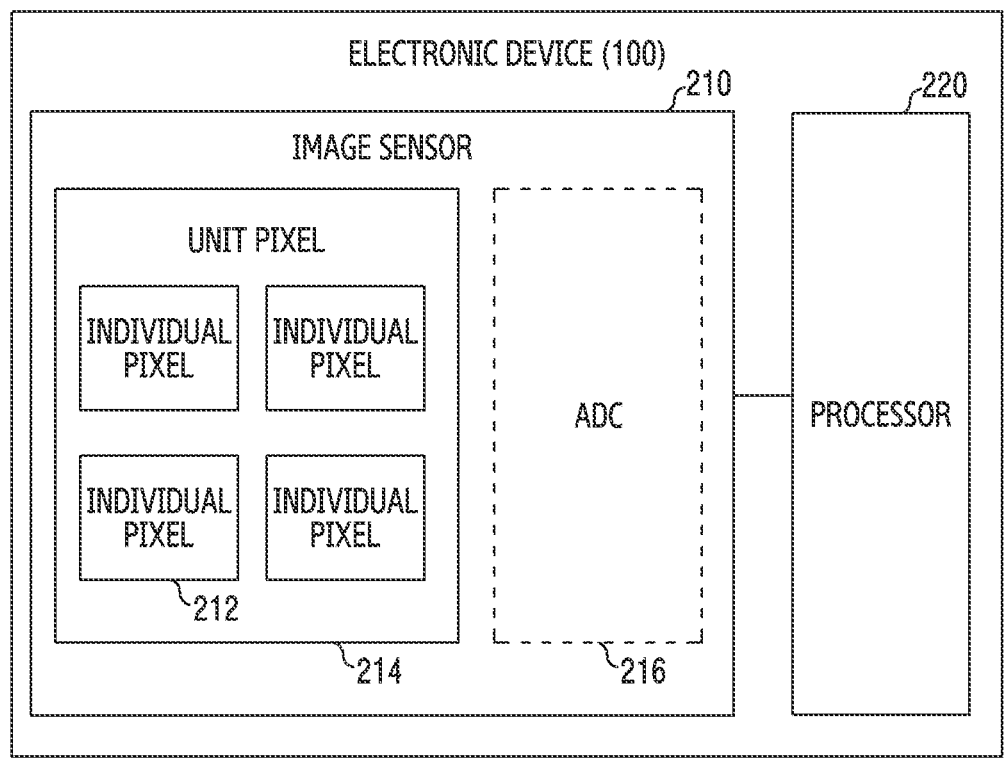
FIG. 2 is a block diagram illustrating a hardware configuration of an electronic device according to an embodiment of the disclosure.

FIG. 2 is a block diagram illustrating a hardware configuration of an electronic device according to an embodiment of the disclosure.

Referring to FIG. 2, the electronic device 100 may include an image sensor 210 and a processor 220. The image sensor 210 may refer to the image sensor 120 shown in FIG. 1. According to an embodiment, the processor 220 may be understood as including the image signal processor 130 shown in FIG. 1. Elements shown in FIG. 2 that are similar to elements shown in FIG. 1 will not be explained or will only be explained briefly.

The image sensor 210 may include a plurality of unit pixels 214. Each unit pixel 214 may include two or more individual pixels 212. For example, one unit pixel 214 may include four (4) or nine (9) individual pixels 212. According to an embodiment, the image sensor 210 may further include an analog digital converter (ADC) 216.

The image sensor 210 may have the plurality of unit pixels 214 integrated thereinto, and each unit pixel 214 may include a micro lens, a color filter and two or more individual pixels 212. A configuration of the unit pixels 214 will be described below with reference to FIG. 3.

The image sensor 210 may convert analog data into digital data through the ADC 216. Operations of the ADC 216 will be described below with reference to FIG. 4.

The processor 220 may be understood as including at least one processor. For example, the processor 220 may include at least one of an application processor (AP), an image signal processor 130, and a communication processor (CP).

The processor 220 may determine a photographing environment of the electronic device 100, and may determine a photographing mode according to the photographing environment. For example, the electronic device 100 may control the image sensor 210 to photograph an image in any one mode (for example, a first mode, a second mode, a third mode, or a fourth mode) of a plurality of photographing modes according to the photographing environment. The photographing environment and the photographing mode will be described below with reference to FIGS. 3, 4, 5, 6, 7A, 7B, 8, 9, 10, 11, 12, 13, and 14.

Referring to FIGS. 3 to 6, the first mode of the photographing modes of the electronic device 100 according to an embodiment of the disclosure will be described. The electronic device 100 may acquire a high dynamic range (HDR) image through the first mode.

Figure 3:
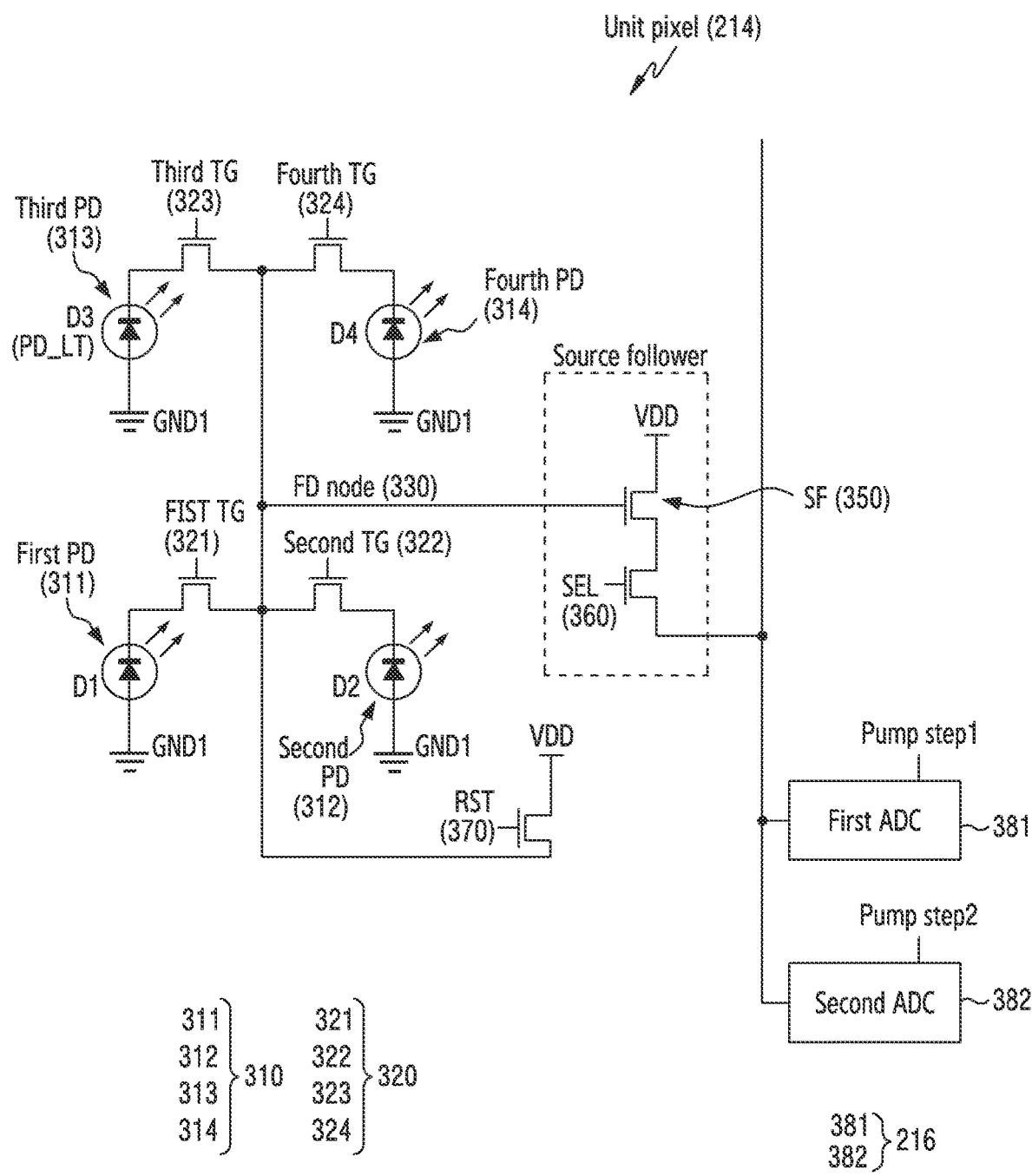
FIG. 3 is a circuit diagram of a unit pixel of an image sensor according to an embodiment of the disclosure.

FIG. 3 is a circuit diagram of a unit pixel of an image sensor according to an embodiment of the disclosure.

Referring to FIG. 3, the unit pixel 214 may include a plurality of PDs 310, transfer gates (TGs) 320 corresponding to the PDs, a floating diffusion (FD) 330, a source follower (SF) 350, a row select (SEL) 360, a reset gate (RST) 370, and at least one ADC 216.

The unit pixel 214 may include four (4) PDs 310. For example, the unit pixel 214 may include four (4) PDs (for example, a first PD 311, a second PD 312, a third PD 313, and a fourth PD 314) having an arrangement of 2×2. The unit pixel 214 may include four (4) PDs 310 having an arrangement of 2×2 and a single FD 330 connected with the four (4) PDs 310. For example, the unit pixel 214 may refer to a micro lens unit or a color filter unit. The unit pixel 214 may include five or more PDs 310. For example, the unit pixel 214 may include nine (9) PDs 310 having an arrangement of 3×3. The unit pixel 214 may include nine (9) PDs 310 having an arrangement of 3×3 and a single FD 330 connected with the nine (9) PDs 310. In another example, the unit pixel 214 may include sixteen (16) PDs 310 having an arrangement of 4×4, or eight (8) PDs 310 having an arrangement of 2×4. In the disclosure, it is assumed that the unit pixel 214 includes four (4) PDs 310 having the arrangement of 2×2, but this is merely an example and various embodiments and arrangements implementable by those skilled in the art are possible.

It may be understood that the individual pixel 212 shown in FIG. 2 corresponds to any one of the first PD 311, the second PD 312, the third PD 313, or the fourth PD 314. For example, it may be understood that the individual pixel 212 includes the first PD 311. In another example, it may be understood that the individual pixel 212 includes the first PD 311 and a first TG 321.

Electric charges accumulated in the PD 310 during an exposure time may move to the FD 330 when the TG 320 is in an on-state. For example, electric charges accumulated in the first PD 311 may move to the FD 330 when the first TG 321 is in an on-state. The image sensor 210 may acquire analog data corresponding to the electric charges moved to the FD 330. For example, the analog data may include information regarding a quantity of electric charges accumulated in the PD 310 during the exposure time.

The image sensor 210 may acquire analog data through the individual pixel 212 or the unit pixel 214. For example, the image sensor 210 may control the TG 320 to acquire analog data corresponding to light quantity data acquired through at least one of the PDs 310. For example, the image sensor 210 may acquire light quantity data through the first PD 311, the second PD 312, the third PD 313, and the fourth PD 314 during an exposure time. When the image sensor 210 switches the first TG 321 to an on-state, the image sensor 210 may acquire analog data based on light quantity data acquired through the first PD 311. When the image sensor 210 switches the first TG 321, a second TG 322, a third TG 323, and a fourth TG 324 to the on-state, the image sensor 210 may acquire analog data based on light quantity data acquired through the first PD 311, the second PD 312, the third PD 313, and the fourth PD 314.

The image sensor 210 may acquire analog data based on light quantity data acquired through any one PD of the four (4) PDs 310. For example, it may be understood that the image sensor 210 acquires analog data through the individual pixel 212. According to another embodiment, the image sensor 210 may acquire analog data based on light quantity data acquired through at least two PDs of the four (4) PDs 310. For example, it may be understood that the image sensor 210 acquires analog data through the unit pixel 214.

According to an embodiment of the disclosure, unlike in FIGS. 2 and 3, the image sensor may include a plurality of pixels and each pixel of the plurality of pixels may include a single PD and a single FD. For example, the image sensor may include a single PD and a single FD. The image sensor may include only one of each of the FD and the PD. The image sensor may acquire analog data based on light quantity data acquired through the PD. Embodiments related to a mode disclosed in the disclosure may be applied to an image sensor including a single PD and a single FD.

Electric charges stored in the FD 330 may be read out through the SF 350 and may be outputted as an electric signal. The image sensor 210 may acquire digital data by digitally converting the analog data through the ADC 216. For example, the digital data may be understood as meaning image data.

The image sensor 210 may acquire first digital data by digitally converting analog data with first sensitivity, and may acquire second digital data by digitally converting analog data with second sensitivity which is higher than the first sensitivity. For example, the image sensor 210 may digitally convert the analog data with the first sensitivity through a first ADC 381, and may digitally convert the analog data with the second sensitivity through a second ADC 382. In another example, the image sensor may include a single ADC per pixel column unlike in FIG. 3. The image sensor may digitally convert the analog data with the first sensitivity through the single ADC at a first time, and may digitally convert the analog data with the second sensitivity through the single ADC at a second time which follows the first time. Operations of the ADC and digital conversion are described below with reference to FIGS. 4 to 6.

The image sensor 210 may change the SEL 360 from the off-state to the on-state to output image data of a specific row.

The image sensor 210 may perform a correlated double sampling (CDS) operation to reduce a noise. For example, the image sensor 210 may switch the RST 370 to an on-state and may reset data accumulated in the FD 330, and may read out reset data remaining after resetting. The image sensor 210 may switch the RST 370 to an off-state and then may move electric charges accumulated in the PD 310 to the FD 330, and may acquire first readout data and second readout data by reading out the electric charges moved to the FD 330. The image sensor 210 may acquire the first digital data based on a difference between the first readout data and the reset data, and may acquire the second digital data based on a difference between the second readout data and the reset data.

Figure 4:
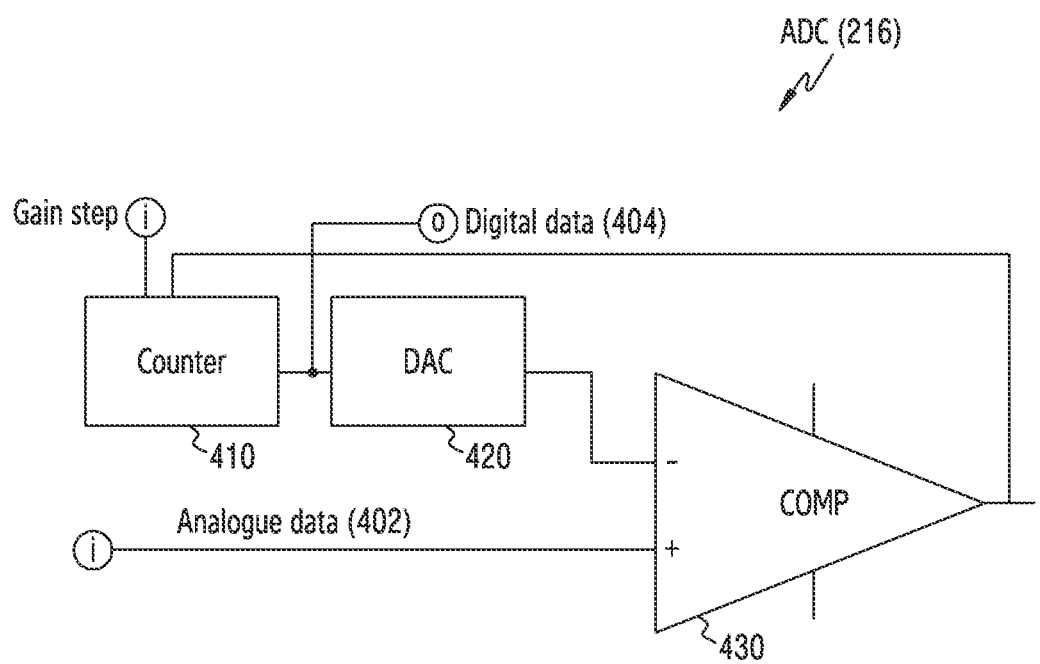
FIG. 4 is a view illustrating a configuration of an analog digital converter (ADC) included in the image sensor according to an embodiment of the disclosure.

FIG. 4 illustrates a configuration of an ADC included in an image sensor according to an embodiment of the disclosure.

Referring to FIG. 4, the ADC 216 may convert analog data 402 which is acquired through the individual pixel 212 (for example, the first PD 311) or the unit pixel 214 (for example, the first PD 311, the second PD 312, the third PD 313, and the fourth PD 314) into digital data 404. For example, the image sensor 210 may acquire first digital data by digitally converting the analog data 402 with the first sensitivity through the ADC 216, and may acquire second digital data by digitally converting the analog data 402 with the second sensitivity, which is higher than the first sensitivity.

The ADC 216 may include a counter 410, a digital analog converter (DAC) 420, and a comparator 430. For example, the counter 410 may output a count value corresponding to designated sensitivity (for example, the first sensitivity, the second sensitivity). The count value may be a value that increases at a designated speed according to the designated sensitivity. The DAC 420 may convert the count value received from the counter 410 into an analog signal, and may provide the converted analog count value to the comparator 430. The comparator 430 may receive the converted analog count value from the DAC 420, and may compare the converted analog count value and a value of the analog data 402 in size. The comparator 430 may provide a specific signal to the counter 410 in response to the converted analog count value being larger than the value of the analog data 402. The counter 410 may output digital data 404 corresponding to the value of the analog data 402 in response to the specific signal being received.

The count value outputted by the counter 410 may increase at different speeds according to designated sensitivity. For example, as the designated sensitivity is higher, the counter value may increase more slowly. For example, it may be understood that a gain step becomes smaller as the sensitivity increases. The count value will be described below with reference to FIG. 5.

Figure 5:
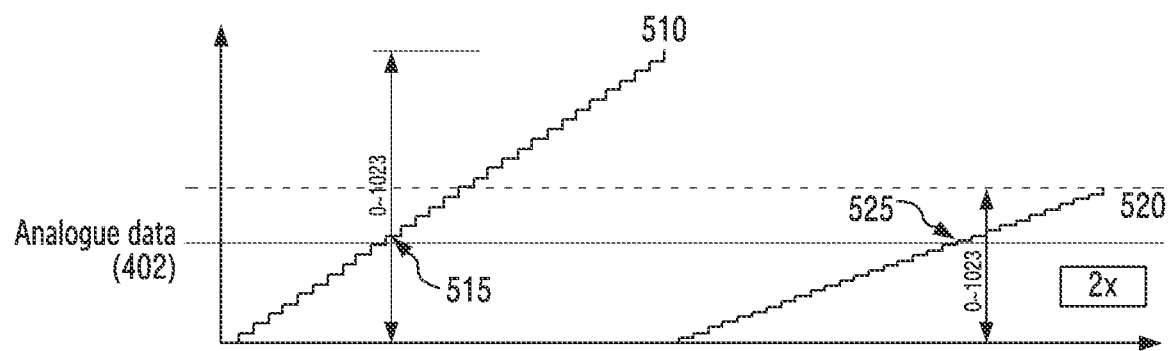
FIG. 5 is a view illustrating an example of digitally converting, by the image sensor, analog data with different sensitivity according to an embodiment of the disclosure.

FIG. 5 is a view illustrating an example of digitally converting analog data with different sensitivity by an image sensor according to an embodiment of the disclosure.

Referring to FIG. 5, the image sensor 210 may acquire first digital data by digitally converting the analog data 402 with first sensitivity through the ADC 216, and may acquire second digital data by digitally converting the analog data 402 with second sensitivity which is higher than the first sensitivity. The first sensitivity may be one time and the second sensitivity may be two times. The first sensitivity and the second sensitivity may be variously set. For example, a ratio between the first sensitivity and the second sensitivity may be 4, 8, or 16.

Referring to FIG. 5, the ADC 216 may digitally convert the analog data 402 by using a count value 510 corresponding to the first sensitivity, and may digitally convert the analog data 402 by using a count value 520 corresponding to the second sensitivity. When the second sensitivity is higher than the first sensitivity, a speed at which the count value 520 corresponding to the second sensitivity increases may be slower than a speed at which the count value 510 corresponding to the first sensitivity increases. For example, it may be understood that a gain step of the count value 510 corresponding to the first sensitivity is larger than a gain step of the count value 520 corresponding to the second sensitivity. The gain step may be a pre-set constant or may be a constant that is determined by an application using the image sensor 210.

The analog data 402 that the image sensor 210 acquires through the individual pixel 212 or the unit pixel 214 may have a certain value. The ADC 216 may acquire the first digital data by digitally converting the analog data 402 based on the count value 510 corresponding to the first sensitivity, which is outputted by the counter 410. In addition, the ADC 216 may acquire the second digital data by digitally converting the analog data 402 based on the count value 502 corresponding to the second sensitivity, which is outputted by the counter 410. For example, the first digital data may have a first value 515, and the second digital data may have a second value 525.

The value of the first digital data and the value of the second digital data may be determined based on the first sensitivity and the second sensitivity. For example, the second value 525 may be larger than the first value 515. For example, when the first digital data and the second digital data have 10 bits, the first digital data and the second digital data may have a value from 0 to 1023. The first value 515 may be a value that is smaller than 512 from among values 0 to 1023, and the second value 525 may be a value that is larger than 512 from among values 0 to 1023. The first value 515 and the second value 525 may be acquired variously according to a ratio between the first sensitivity and the second sensitivity. For example, when the ratio between the first sensitivity and the second sensitivity is greater than 2, a difference between the first value 515 and the second value 525 may become larger.

The image sensor 210 may include the first ADC 381 and the second ADC 382 as shown in FIG. 3, and the first ADC 381 may digitally convert the analog data 402 with the first sensitivity, and the second ADC 381 may digitally convert the analog data 402 with the second sensitivity. For example, the first ADC 381 may digitally convert the analog data 402 by using the count value 510 corresponding to the first sensitivity, and the counter 410 included in the second ADC 382 may digitally convert the analog data 402 by using the count value 520 corresponding to the second sensitivity. According to another embodiment, the image sensor may include a single ADC per pixel column, and may digitally convert the analog data 402 with the first sensitivity through the single ADC at a first time, and may digitally convert the analog data 402 with the second sensitivity through the single ADC at a second time which follows the first time. When the analog data 402 is digitally converted through the first ADC 381 and the second ADC 382, the time required to digitally convert the analog data 402 may be reduced compared to the case where the single ADC is used.

The image sensor 210 may provide the first digital data which is acquired by digitally converting the analog data 402 with the first sensitivity, and the second digital data which is acquired by digitally converting the analog data 402 with the second sensitivity to the processor 220. The processor 220 may acquire an image frame based on the first digital data and the second digital data. For example, the processor 220 may acquire an HDR image based on the first digital data and the second digital data. The operation of acquiring, by the processor 220, the HDR image based on the first digital data and the second digital data will be described below with reference to FIG. 9.

Figure 6:
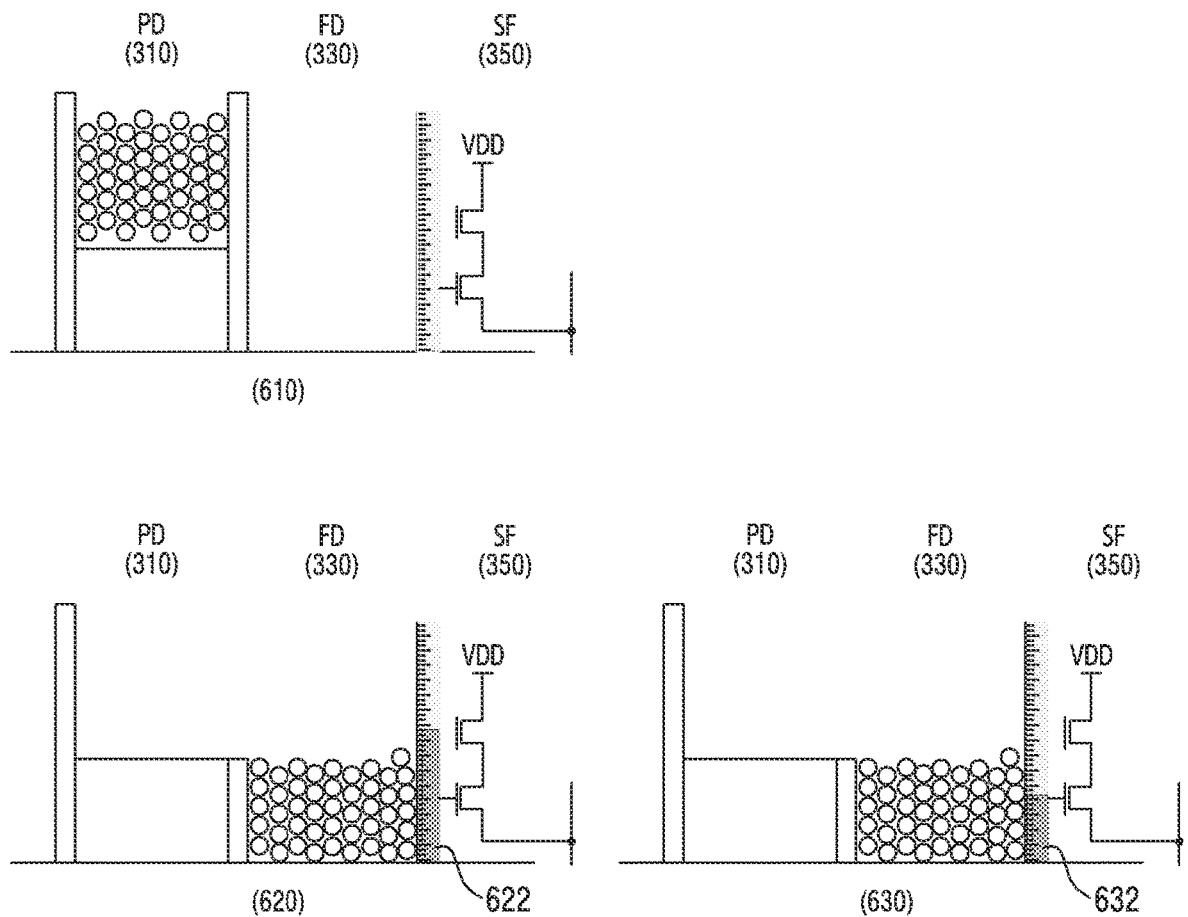
FIG. 6 is a view illustrating an example of modeling electric charges into marbles during an operation of the image sensor according to an embodiment of the disclosure.

FIG. 6 illustrates an example of modeling electric charges into marbles during an operation of the image sensor 210 according to an embodiment of the disclosure.

FIG. 6 is a view illustrating modeling on the assumption that electric charges accumulated in the PD 310 and the FD 330 in the first mode explained in FIGS. 3 to 5 are expressed by marbles which are subjected to the gravity.

Referring to FIG. 6, as shown in reference numeral 610, electric charges may be accumulated in the PD 310 when the TG 320 is in an off-state.

When the TG 320 is switched to an on-state, the electric charges accumulated in the PD 310 may be moved to the FD 330 as shown in reference numerals 620 and 630. The image sensor 210 may digitally convert analog data corresponding a quantity of electric charges moved to the FD 330 by using the SF 350. For example, in reference numeral 620, the image sensor 210 may acquire first digital data by digitally converting the analog data with first sensitivity 622 through the ADC 216. In addition, in reference numeral 630, the image sensor 210 may acquire second digital data by digitally converting the analog data with second sensitivity 632 through the ADC 216.

The image sensor 210 may acquire the first digital data and the second digital data by digitally converting the electric charges accumulated in the PD 310 with different sensitivity through a single exposure. The processor 220 may acquire an HDR image based on the first digital data and the second digital data.

Figure 7A:
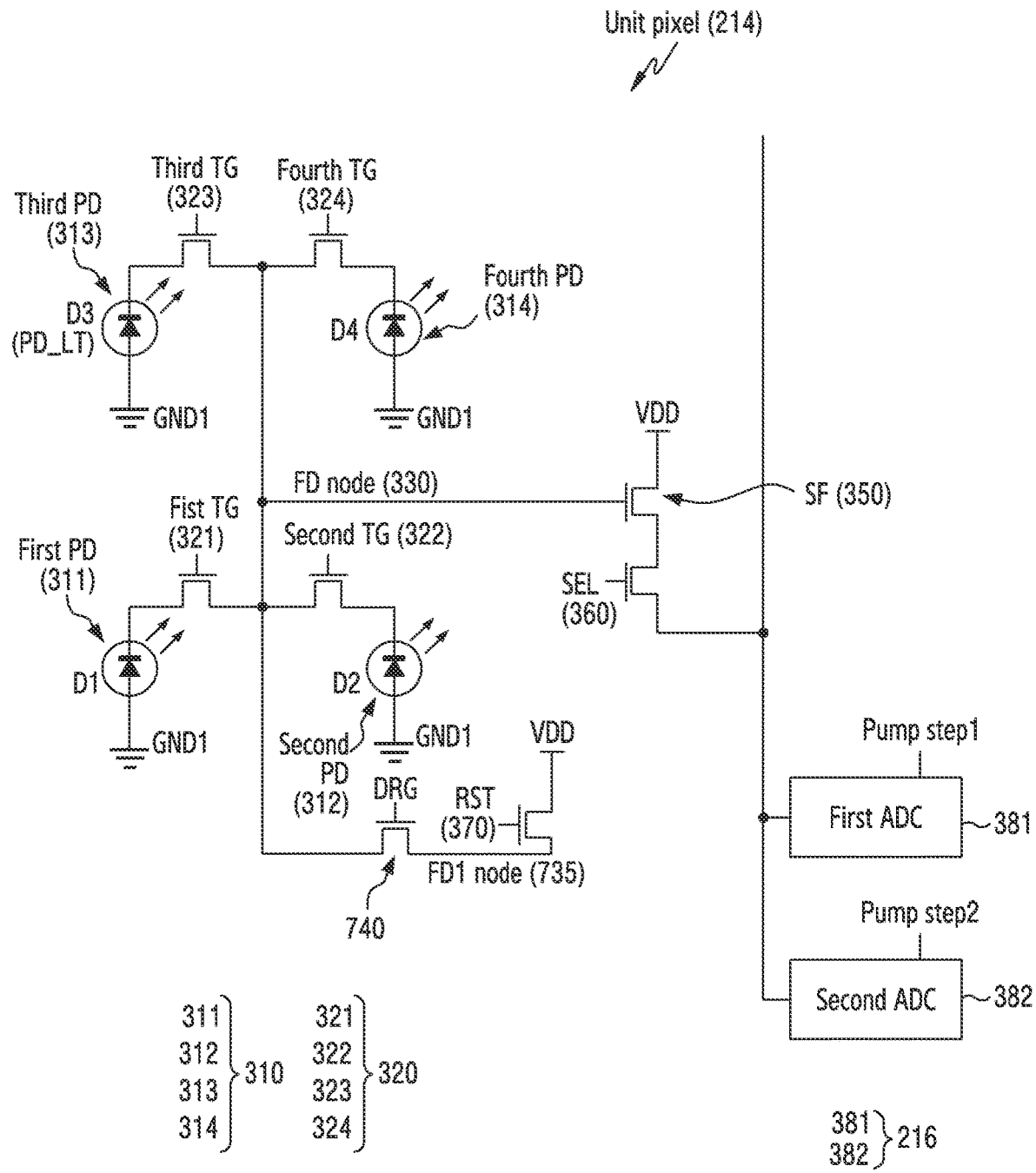
FIG. 7A is a circuit diagram of a unit pixel of the image sensor which is capable of adjusting a conversion gain according to an embodiment of the disclosure.
Figure 7B:
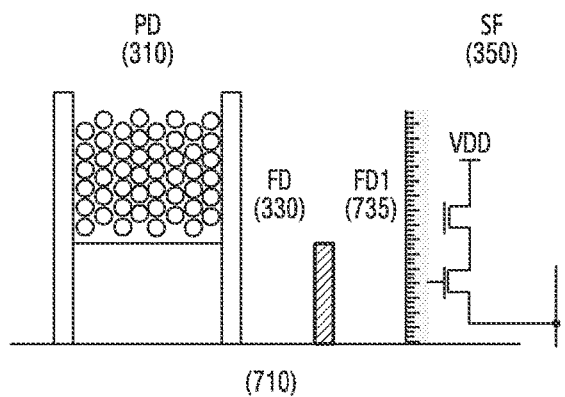
FIG. 7B is a view illustrating an example of modeling electric charges into marbles during an operation of the image sensor according to an embodiment of the disclosure.
Figure 7B:
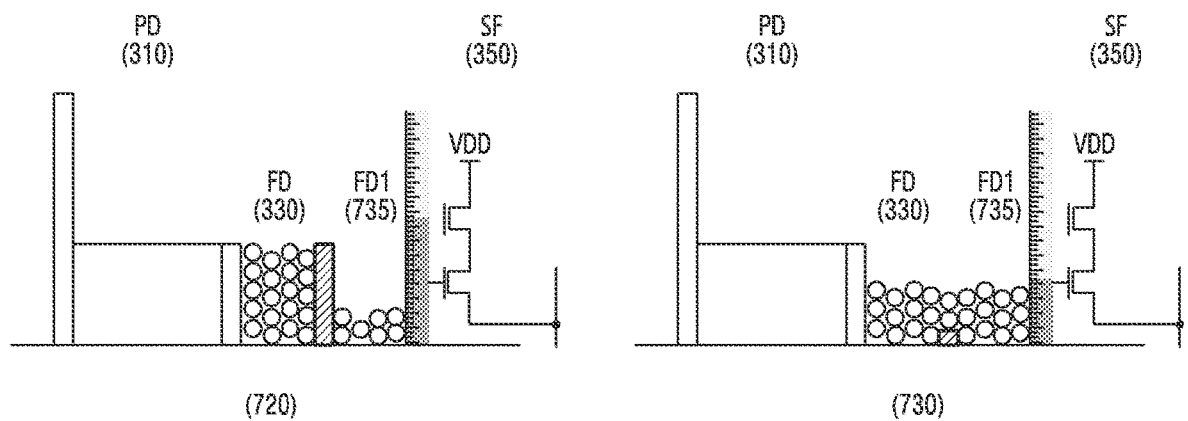

FIGS. 7A and 7B illustrate a second mode from among the photographing modes of the electronic device 100 according to an embodiment. The electronic device 100 may acquire an HDR image through the second mode.

FIG. 7A is a circuit diagram of a unit pixel of an image sensor that is capable of adjusting a conversion gain according to an embodiment of the disclosure.

Referring to FIG. 7A, compared to that of FIG. 3, the unit pixel 214 in FIG. 7A may further include a dynamic range gate (DRG) 740 and an FD1 735. The same configurations in FIG. 7A as those explained in FIG. 3 will not be explained or will be briefly explained.

The image sensor 210 may include the DRG 740 and two FD areas (e.g., the FD 330, the FD1 735). The conversion gain of the image sensor 210 may vary according to a size of an FD storage space. The image sensor 120 may read out a high conversion gain (HCG) when the size of the FD storage space is small, and may read out a low conversion gain (LCG) when the size of the FD storage space is large. For example, the unit pixel 214 may include the FD 330 and the FD1 735. When the image sensor 210 reads out electric charges stored in the FD 330, the conversion gain of the image sensor 210 may be the HCG, and, when the image sensor 210 reads out electric charges stored in the FD 330 and the FD1 735 altogether, the conversion gain of the image sensor 210 may be the LCG.

The image sensor 210 may adjust the conversion gain according to an on/off state of the DRG 740. For example, when the DRG 740 is in an off-state, the conversion gain of the image sensor 120 may be the HCG, and, when the DRG 440 is in an on-state, the conversion gain of the image sensor 120 may be the LCG.

The image sensor 210 may read out light quantity data inputted to the unit pixel 214 according to the HCG through a single exposure, and may then read out according to the LCG. For example, the image sensor 210 may move electric charges accumulated in the four (4) PDs 310 to the FD 330 during an exposure time, and may then read out according to the HCG, and may switch the DRG 740 to an on-state and may read out according to the LCG. According to another embodiment, the image sensor 210 may read out light quantity data inputted to the individual pixel 212 through a single exposure, according to the HCG, and may then read out according to the LCG. For example, the image sensor 210 may read out according to the HCG and the LCG based on electric charges accumulated in one PD (e.g., the first PD 311) during an exposure time.

The image sensor 210 may acquire first image data according to a first conversion gain based on light quantity data inputted to the unit pixel 214, and may acquire second image data according to a second conversion gain, which is lower than the first conversion gain, based on the light quantity data. For example, the first conversion gain may be an HCG, and the second conversion gain may be a LCG.

The image sensor 210 may perform a CDS operation even when photographing an image through the second mode. For example, the image sensor 210 may switch the RST 370 to an on-state and may reset data accumulated in the FD 330 and the FD1 735, and may read out reset data remaining after resetting. For example, the image sensor 210 may acquire first reset data of the FD 330, and second reset data of the FD1 735. The image sensor 210 may switch the RST 370 to an off-state, and then, may move electric charges accumulated in the PD 310 to the FD 330, and may acquire first readout data by reading the electric charges moved to the FD 330 according to the first conversion gain. The image sensor 210 may switch the DRG 740 to an on-state, and then, may acquire second readout data by reading out the electric charges stored in the FD 330 and the FD1 735 according to the second conversion gain. The image sensor 210 may acquire the first image data based on a difference between the first readout data and the first reset data, and may acquire the second image data based on a difference between the second readout data and a value obtained by adding the first reset data and the second reset data.

When the electronic device 100 photographs an image through the second mode, four readouts are required for each unit pixel 214, but, referring to descriptions regarding FIG. 3, three readouts are required for each unit pixel 214 when an image is photographed through the first mode. Therefore, in the first mode, power consumption may be reduced. For example, when the first mode is used, power consumption may be reduced by about 25% compared to the case where the electronic device 100 photographs an image through the second mode.

The processor 220 may acquire the first image data and the second image data from the image sensor 210. The processor 220 may acquire an HDR image based on the first image data and the second image data. The operation of generating, by the processor 220, the HDR image based on the first image data and the second image data will be described below with reference to FIG. 10.

FIG. 7B illustrates an example of modeling electric charges into marbles during an operation of the image sensor 210 according to an embodiment of the disclosure.

Referring to FIG. 7B, it is a view illustrating modeling on the assumption that electric charges accumulated in the PD 310, the FD 330, and the FD1 735 in the second mode explained in FIG. 7A are expressed by marbles which are subjected to the gravity.

When the TG 320 is in an off-state, electric charges may be accumulated in the PD 310 as shown in reference numeral 710.

When the TG 320 is switched to an on-state, the electric charges accumulated in the PD 310 may be moved to the FD 330 as shown in reference numeral 720. The image sensor 210 may acquire first image data corresponding to a quantity of electric charges moved to the FD 330 by using the SF 350. For example, the image sensor 210 may acquire the first image data by reading out the electric charges stored in the FD 330 according to a first conversion gain (for example, an HCG).

When the DRG 740 is switched to an on-state, some of the electric charges stored in the FD 330 may be moved to the FD1 735 as shown in reference numeral 730. The image sensor 210 may acquire second image data corresponding to a quantity of electric charges stored in the FD 330 and the FD1 735 by using the SF 350. For example, the image sensor 210 may acquire the second image data by reading out the electric charges stored in the FD 330 and the FD1 735 according to a second conversion gain (e.g., an LCG).

The image sensor 210 may acquire the first image data and the second image data by reading out the electric charges accumulated in the PD 310 through a single exposure, according to different conversion gains. The processor 220 may acquire a HDR image based on the first image data and the second image data.

Figure 8:
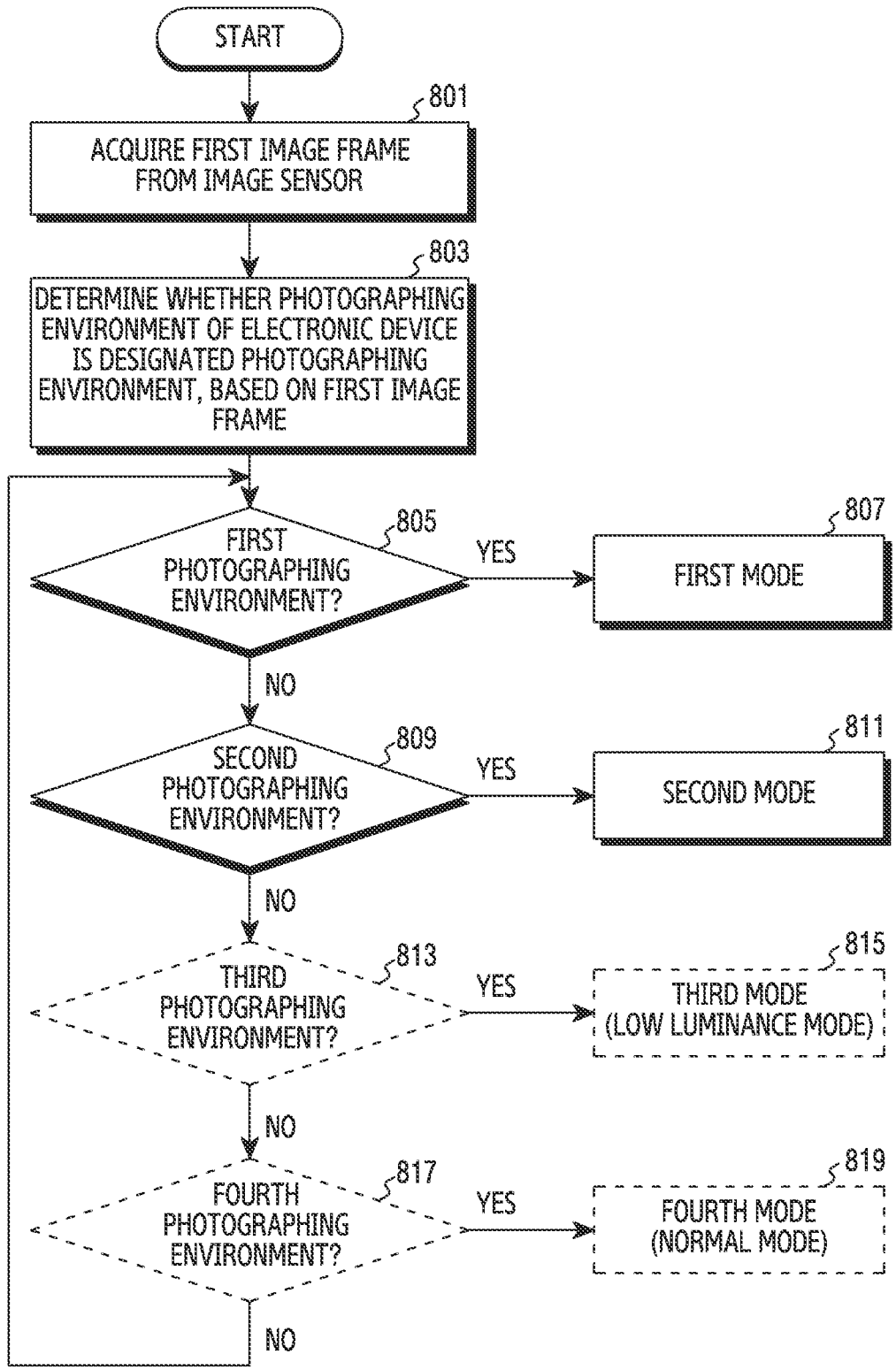
FIG. 8 is a flowchart illustrating an operation of determining a photographing mode according to determination of a photographing environment by an electronic device according to an embodiment of the disclosure.

FIG. 8 is a flowchart illustrating an operation of determining, by an electronic device, a photographing mode according to determination of a photographing environment according to an embodiment of the disclosure. Operations illustrated in FIG. 8 may be performed by the processor 220 shown in FIG. 2.

Referring to FIG. 8, in operation 801, the processor 220 may acquire a first image frame from the image sensor 210.

In operation 803, the processor 220 may determine whether a photographing environment of the electronic device 100 corresponds to a designated photographing environment, based on the first image frame.

The processor 220 may determine the photographing environment of the electronic device 100, based on the first image frame. For example, the processor 220 may determine whether a scene corresponding to the first image frame is made with backlight, by analyzing the first image frame, and may determine the photographing environment based on the determination. In another example, the processor 220 may determine the photographing environment based on ambient illumination of the electronic device 100 by analyzing the first image frame or based on ambient illuminance of the electronic device 100, which is measured by analyzing the first image frame or by using an illuminance sensor included in the electronic device 100. In another example, the electronic device 100 may determine the photographing environment, based on whether a person is included in subjects of the first image frame.

The processor 220 may determine whether the photographing environment of the electronic device 100 requires a HDR function. For example, the processor 220 may determine whether the photographing environment requires the HDR function, based on the first image frame. The processor 220 may determine that the HDR function is required when it is determined that a first area of the first image frame has first brightness greater than or equal to a first threshold value, and a second area distinguished from the first area has second brightness which is darker than the first brightness and is less than or equal to a second threshold value, while taking a picture using an auto exposure (AE) function. In another example, when the photographing environment of the first image frame is a backlight environment or a bright outdoor environment, the processor 220 may determine that the HDR function is required. In another example, the processor 220 may determine whether the HDR function is required, by determining things and background based on data which is based on machine learning.

The electronic device 100 may determine the photographing environment by using other appropriate methods/means in addition to or alternatively to the method of acquiring the first image frame. For example, the electronic device 100 may determine the photographing environment, based on a sensor (e.g., an illuminance sensor) provided in the electronic device 100 or a current time/place.

In operation 805, the processor 220 may determine whether the photographing environment of the electronic device 100 correspond to a first photographing environment. For example, when the photographing environment of the electronic device 100 requires the HDR function and a zoom magnification is set to a designated magnification or higher, the processor 220 may determine that the photographing environment corresponds to the first photographing environment. In another example, when the photographing environment of the electronic device 100 requires the HDR function, but the zoom magnification is set to be lower than the designated magnification, the processor 220 may determine that the photographing environment does not correspond to the first photographing environment. In another example, when it is determined that the photographing environment of the electronic device 100 requires the HDR function and power consumption needs to be reduced, the processor 220 may determine that the photographing environment corresponds to the first photographing environment. In another example, the processor 220 may determine whether the photographing environment of the electronic device 100 corresponds to the first photographing environment, based on whether a high pixel output is required or a low pixel output is required. When it is determined that an image of a pixel which is higher than or equal to a reference value should be obtained, the processor 220 may determine that the photographing environment corresponds to the first photographing environment.

In operation 807, the processor 220 may photograph an image in a first mode in response to it being determined that the photographing environment corresponds to the first photographing environment. When the photographing environment corresponds to the first photographing environment, the processor 220 may acquire a second image frame through the first mode. The second image frame may be understood as following the first image frame. For example, the first mode may be understood as the first mode explained above with reference to FIGS. 3 to 6. The first mode will be described below with reference to FIG. 9.

In operation 809, the processor 220 may determine whether the photographing environment of the electronic device 100 corresponds to a second photographing environment. For example, when the photographing environment of the electronic device 100 requires the HDR function and the zoom magnification is set to be less than the designated magnification, the processor 220 may determine that the photographing environment corresponds to the second photographing environment. In another example, when it is determined that it is necessary to reduce a noise included in the first image frame, the processor 220 may determine that the photographing environment corresponds to the second photographing environment. In another example, when it is determined that it is necessary to acquire an image having a pixel less than a reference value, the processor 220 may determine that the photographing environment corresponds to the second photographing environment.

In operation 811, the processor 220 may photograph an image in a second mode in response to it being determined that the photographing environment corresponds to the second photographing environment. When the photographing environment corresponds to the second photographing environment, the processor 220 may acquire the second image frame through the second mode. For example, the second mode may be understood as the second mode described above with reference to FIGS. 7A and 7B. The second mode will be described below with reference to FIG. 10.

In operation 813, the processor 220 may determine whether the photographing environment corresponds to a third photographing environment. For example, when it is determined that ambient illuminance of the electronic device 100 is less than a reference value, the processor 220 may determine that the photographing environment corresponds to the third photographing environment. In another example, when it is determined that an optical signal regarding a subject included in the first image frame is less than a reference value, the processor 220 may determine that the photographing environment corresponds to the third photographing environment.

In operation 815, the processor 220 may photograph an image in a third mode in response to the photographing environment corresponding to the third photographing environment. The processor 220 may acquire the second image frame through the third mode when the photographing environment corresponds to the third photographing environment. For example, the third mode may be understood as a low-illuminance mode. The third mode will be described below with reference to FIG. 11.

In operation 817, the processor 220 may determine that the photographing environment corresponds to a fourth photographing environment. For example, when it is determined that the ambient illuminance of the electronic device 100 is within a reference range, the processor 220 may determine that the photographing environment is the fourth photographing environment. In another example, when it is determined that an optical signal regarding a subject included in the first image frame is within a reference range, the processor 220 may determine that the photographing environment corresponds to the fourth photographing environment.

In operation 819, the processor 220 may photograph an image in a fourth mode in response to the photographing environment corresponding to the fourth photographing environment. When the photographing environment corresponds to the fourth photographing environment, the processor 220 may acquire the second image frame through the fourth mode. For example, the fourth mode may be understood as a normal mode. The fourth mode will be described below with reference to FIG. 12.

Referring to FIG. 8, the processor 220 determines the photographing environment by determining whether the photographing environment of the electronic device 100 is the first photographing environment, the second photographing environment, the third photographing environment, and the fourth photographing environment in sequence, but this is merely an example and various embodiments implementable by those skilled in the art are possible. For example, the processor 220 may determine that the photographing environment corresponds to any one of the first to fourth photographing environments, regardless of the order, by referring to whether a designated condition is satisfied. In another example, when a user input to acquire an image in a specific photographing mode is received, the processor 220 may determine that the photographing environment corresponds to the photographing environment corresponding to the user input. In addition, the electronic device 100 may not necessarily be implemented to determine any one of the four photographing environments. For example, in various embodiments, the electronic device 100 may be implemented to determine any one of two photographing environments (for example, the first photographing environment and the second photographing environment), or to determine any one of five or more photographing environments.

Figure 9:
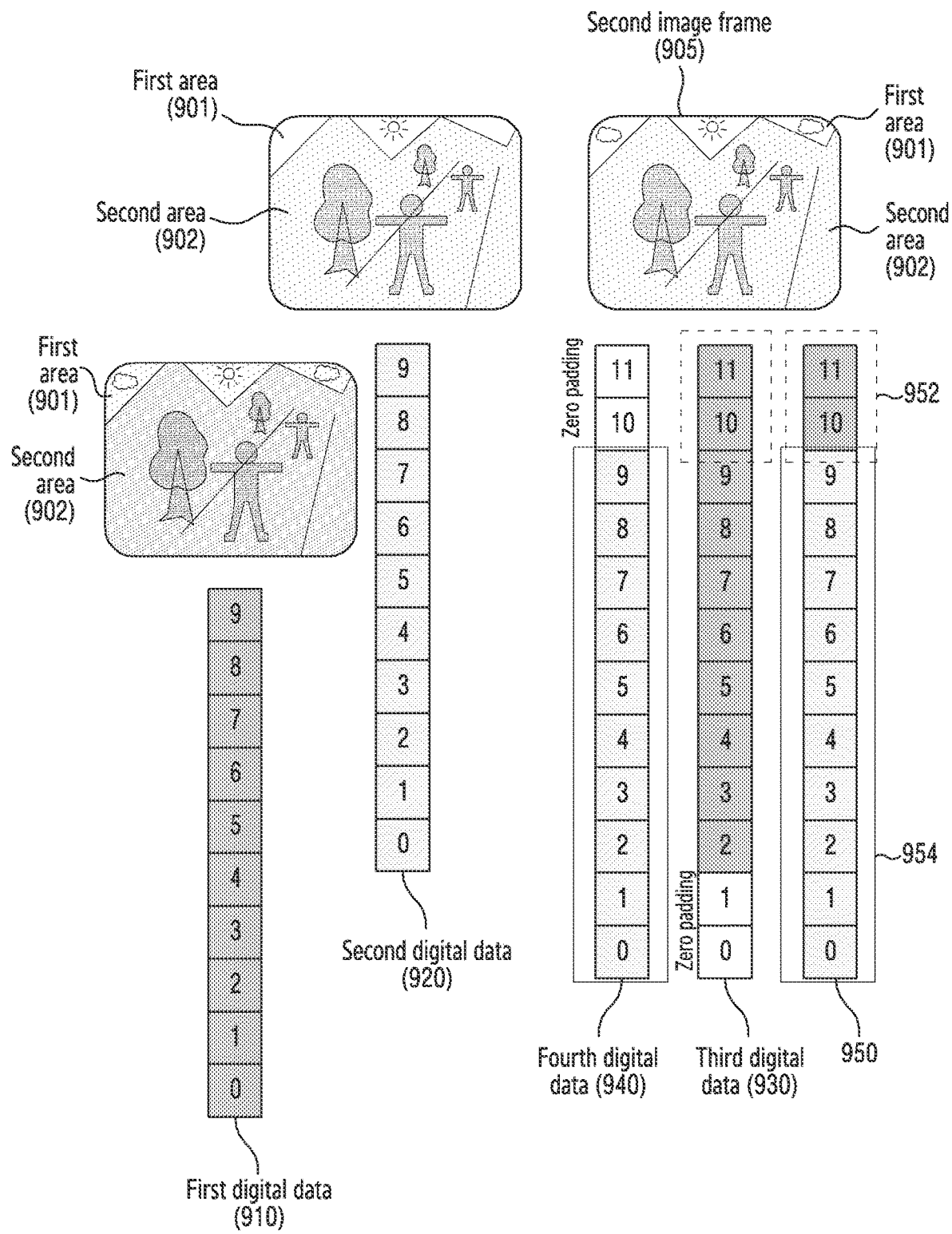
FIG. 9 is a view illustrating an example of acquiring an image in a first mode by the electronic device according to an embodiment of the disclosure.

FIG. 9 illustrates an example of acquiring an image in the first mode by an electronic device according to an embodiment of the disclosure.

Referring to FIG. 9, the processor 220 may photograph an image in the first mode by controlling the image sensor 210 in response to the photographing environment of the electronic device 100 corresponding to the first photographing environment.

The image sensor 210 may acquire analog data (for example, the analog data 402) through pixels. For example, the image sensor 210 may acquire the analog data through the individual pixel 212 or the unit pixel 214. The image sensor 210 may acquire the analog data based on light quantity data which is acquired through any one PD of four (4) PDs (e.g., the first PD 311, the second PD 312, the third PD 313, and the fourth PD 314 of FIG. 3) having an arrangement of 2×2, which are included in the unit pixel 214. The image sensor 210 may acquire the analog data based on light quantity data acquired through at least two PDs among the four (4) PDs. In another example, each pixel of the plurality of pixels included in the image sensor may include a single PD and a single FD, and the image sensor may acquire the analog data based on light quantity data acquired through the single PD.

The image sensor 210 may acquire first digital data 910 by digitally converting the analog data with the first sensitivity, and may acquire second digital data 920 by digitally converting the analog data with the second sensitivity which is higher than the first sensitivity.

Referring to FIG. 9, the first digital data 910 which is digitally converted from the analog data with the first sensitivity by the image sensor 210 may have a smaller value than the second digital data 920 which is digitally converted from the analog data with the second sensitivity. For example, the first digital data 910 may correspond to an image that is darker than the second digital data 920.

Since the second digital data 920 is digitally converted with the second sensitivity which is relatively high, there may be saturated pixels. Referring to FIG. 9, the second digital data 920 may not include an image regarding clouds in a sky area corresponding to a first area 901. For example, since the first area 901 is brighter than a second area 902 by a predetermined level or higher, the second digital data 920 may not be likely to include an image of the first area 901. In this case, since the first digital data 910 is digitally converted with the relatively low first sensitivity, there may be no saturated pixel or there may be few saturated pixels such that they are ignored. For example, the first digital data 910 may include an image of the first area 901 that has no artifact such as a white hole.

The processor 220 may acquire the first digital data 910 and the second digital data 920 from the image sensor 210. The processor 220 may acquire a second image frame 905 which follows a first image frame, based on the first digital data 910 and the second digital data 920. For example, the second image frame 905 may be an HDR image. The processor 220 may perform image fusion by applying two different gamma signals to the first digital data 910 and the second digital data 920. The processor 220 may acquire the second image frame 905 through the fusion. For example, the processor 220 may acquire an HDR image by using dual gamma fusion for the first digital data 910 and the second digital data 920. The processor 220 can enhance quality of the HDR image through the dual gamma fusion. The processor 220 may acquire the HDR image based on an image area that satisfies a designated condition in the first digital data 910 and the second digital data 920, through the dual gamma fusion. The designated condition may refer to a condition where a pixel is not saturated and has brightness of a predetermined level or higher.

The processor 220 may divide an image area corresponding to the second image frame 905 into a first area 901 brighter than a threshold value and a second area 902 darker than the threshold value, and may acquire the second image frame 905 based on the first area 901 of the first digital data 910 and the second area 902 of the second digital data 920. For example, a full image area corresponding to the second image frame 905 may be divided into the first area 901 and the second area 902. The first area 901 may be an area that has brightness higher than or equal to the threshold value, and the second area 902 may be an area that has brightness less than the threshold value. According to an embodiment, the processor 220 may acquire the second image frame 905, based on the first area 901 of the first digital data 910 and the second area 902 of the second digital data 920. The processor 220 may use the second digital data 920, which is acquired with the relatively high sensitivity, for the relatively dark second area 902, and may use the first digital data 910, which is acquired with the relatively low sensitivity, for the relatively bright first area 901. When an image is photographed through the first mode, the processor 220 may acquire the second image frame 905 which has a dynamic range (DR) wider than the DR of the first digital data 910, or the DR of the second digital data 920.

FIG. 9, shows that the processor 220 divides the image area into the first area 901 and the second area 902, and acquires the first area 901 based on the first digital data 910 and acquires the second area 902 based on the second digital data 920, but this is merely an example and various embodiments implementable by those skilled in the art are possible. For example, the processor 220 may divide the image area corresponding to the second image frame 905 into a first area which is brighter than a first threshold value, a second area which has brightness between the first threshold value and a second threshold value, and a third area which is darker than the second threshold value. The second area may be understood as an area having appropriate brightness or appropriate DR. The processor 220 may acquire an image of the first area, which is brighter than the first threshold value, based on the first digital data 910, and may acquire an image of the third area, which is darker than the second threshold value, based on the second digital data 920. The processor 220 may acquire an image of the second area, which has brightness between the first threshold value and the second threshold value, by combining the first digital data 910 and the second digital data 920, or may acquire based on third digital data (not shown) acquired by digitally converting the analog data through third sensitivity which is distinguished from the first sensitivity or the second sensitivity.

The processor 220 may acquire the second image frame 905 through zero padding for the first digital data 910 and the second digital data 920. The processor 220 may acquire third digital data 930 having a third number by adding first dummy data having a bit of a second number to the first digital data 910 having a bit of a first number. In addition, the processor 220 may acquire fourth digital data 940 having the third number by adding second dummy data having the bit of the second number to the second digital data 920 having the bit of the first number. The first number, the second number, and the third number may be natural numbers. For example, the first number may be 10, the second number may be 2, and the third number may be 12. In another example, the first number may be 12, the second number may be 2, and the third number may be 14.

Referring to FIG. 9, the processor 220 may acquire the third digital data 930 by adding the first dummy data to the first digital data 910 through least significant bit (LSB) zero padding, and may acquire the fourth digital data 940 by adding the second dummy data to the second digital data 920 through most significant bit (MSB) zero padding. For example, the first dummy data and the second dummy data may be '00'.

The processor 220 may acquire the second image frame 905, based on the third digital data 930 and the fourth digital data 940. The processor 220 may acquire image data 950 based on part of the third digital data 930 and part of the fourth digital data 940. For example, the processor 220 may acquire the image data 950 based on the other bits except for the two most significant bits of the third digital data 930 and the two most significant bits of the fourth digital data 940. A first bit group 952 of the image data 950 may correspond to the two most significant bits of the third digital data 930, and a second bit group 954 of the image data 950 may correspond to the other bits except for the two most significant bits of the fourth digital data 940. In an embodiment, the processor 220 may acquire the second image frame 905 based on the image data 950.

The processor 220 may acquire first light quantity data through a plurality of pixels (for example, the individual pixel 212, the unit pixel 214, or a pixel (not shown) including a single PD and a single FD) during a first exposure time in response to the photographing environment of the electronic device 100 corresponding to the first photographing environment. For example, when the first mode is used, the processor 220 may determine an exposure time of the image sensor 210 as the first exposure time. When the second mode, the third mode or the fourth mode is used, the processor 220 may determine the exposure time of the image sensor 210 as a second exposure time. In an embodiment, the first exposure time may be shorter than the second exposure time. For example, when the first mode is used, the processor 220 may reduce a quantity of electric charges (e.g., the first light quantity data) accumulated in the PD by reducing the exposure time. For example, when analog data is acquired based on a quantity of electric charges accumulated in two or more PDs, the processor 220 may reduce the exposure time by considering the quantity of electric charges accumulated in the PD and an FD storage space. In another embodiment, the first exposure time may not be shorter than the second exposure time. For example, even when the first mode is not used, the processor 220 may not reduce the exposure time or may not reduce the quantity of electric charges accumulated in the PD. For example, even when analog data is acquired based on a quantity of electric charges accumulated in a single PD or analog data is acquired based on a quantity of electric charges accumulated in two or more PDs, the processor 220 may not reduce the exposure time if it is determined that the FD storage space is sufficient.

Figure 10:
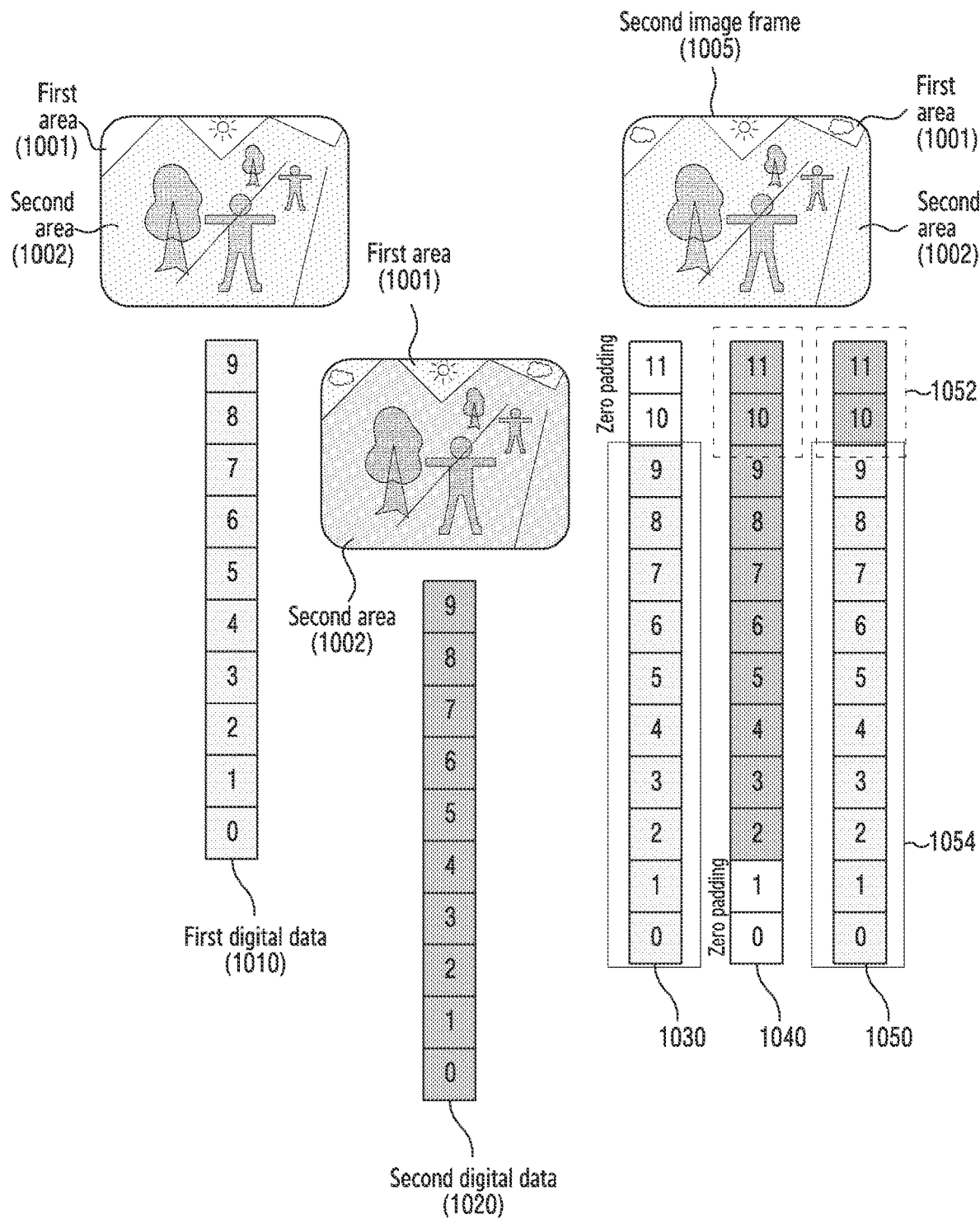
FIG. 10 is a view illustrating an example of acquiring an image in a second mode by the electronic device according to an embodiment of the disclosure.

FIG. 10 illustrates an example of acquiring an image in the second mode by an electronic device according to an embodiment of the disclosure.

Referring to FIG. 10, the processor 220 may photograph an image in the second mode by controlling the image sensor 210, in response to the photographing environment of the electronic device 100 corresponding to the second photographing environment.

The image sensor 210 may acquire first image data 1010 according to a first conversion gain (e.g., an HCG) based on light quantity data inputted to the unit pixel 214, and may acquire second image data 1020 according to a second conversion gain (e.g., a LCG) based on the light quantity data. The image sensor 210 may acquire the first image data and the second image data, based on light quantity data which is acquired through at least two PDs of four (4) PDs (for example, the first PD 311, the second PD 312, the third PD 313, and the fourth PD 314 of FIG. 3) included in the unit pixel 214.

Referring to FIG. 10, the first image data 1010 that is read out by the image sensor 210 according to the first conversion gain may correspond to a bright image compared to the second image data 1020 that is read out according to the second conversion gain which is lower than the first conversion gain. Since the first image data 100 is read out according to the first conversion gain which is relatively high, there may be saturated pixels. Referring to FIG. 10, the first image data 1010 may not include an image regarding clouds in a sky area corresponding to a first area 1001. For example, since the first area 1001 is brighter than a second area 1002 by a predetermined level or higher, the first image data 1010 may not be likely to include an image of the first area 1001. In this case, since the second image data 1020 is read out according to the second conversion gain which is relatively low, there may be no saturated pixel or there may be few saturated pixels such that they are ignored. For example, the second image data 1020 may include the image of the first area 1001 having no artifact such as a white hole.

The processor 220 may acquire the first image data 1010 and the second image data 1020 from the image sensor 210. The processor 220 may acquire a second image frame 1005 which follows a first image frame, based on the first image data 1010 and the second image data 1020. For example, the second image frame 1005 may be an HDR image.

The processor 220 may divide an image area corresponding to the second image frame 1005 into a first area 1001 which is brighter than a threshold value, and a second area 1002 which is darker than the threshold value, and may acquire the second image frame 1005 based on the first area 1001 of the second image data 1020 and the second area 1002 of the first image data 1010. The processor 220 may acquire the second image frame 1005, based on the second area 1002 of the first image data 1010 and the first area 1001 of the second image data 1020. For example, the processor 220 may use the first image data 1010, which is acquired according to the relatively high conversion gain, for the relatively dark second area 1002, and may use the second image data 1020, which is acquired according to the relatively low conversion gain, for the relatively bright first area 1001. When an image is photographed through the second mode, the processor 220 may acquire the second image frame 1005 having a DR wider than the DR of the first image data 1010 or the DR of the second image data 1020.

FIG. 10, shows that the processor 220 divides the image area into the first area 1001 and the second area 1002, but this is merely an example and various embodiments implementable by those skilled in the art are possible. For example, as described with reference to FIG. 9, the processor 220 may divide the image area into a first area brighter than a first threshold value, a second area having brightness between the first threshold value and a second threshold value, and a third area darker than the second threshold value.

The processor 220 may acquire the second image frame 1005 through zero padding for the first image data 1010 and the second image data 1020. The processor 220 may acquire third image data 1030 by adding first dummy data having a bit of a second number to the first image data 1010 having a bit of a first number. In addition, the processor 220 may acquire fourth image data 1040 by adding second dummy data having the bit of the second number to the second image data 1020 having the bit of the first number. The first number, the second number, and the third number may be natural numbers. The first number may be 10, the second number may be 2, and the third number may be 12. In another example, the first number may be 12, the second number may be 2, and the third number may be 14.

Referring to FIG. 10, the processor 220 may acquire the third image data 1030 by adding the first dummy data to the first image data 1010 through MSB zero padding, and may acquire the fourth image data 1040 by adding the second dummy data to the second image data 1020 through LSB zero padding. For example, the first dummy data and the second dummy data may be '00'.

The processor 220 may acquire the second image frame 1005 based on the third image data 1030 and the fourth image data 1040. According to an embodiment, the processor 220 may acquire fifth image data 1050 based on a part of the third image data 1030 and a part of the fourth image data 1040. For example, the processor 224 may acquire the fifth image data 1050, based on the other bits except for the two most significant bits of the fourth image data 1040, and the two most significant bits of the third image data 1030. A first bit group 1052 of the fifth image data 1050 may correspond to the two most significant bits of the fourth image data 1040, and a second bit group 1054 of the fifth image data 1050 may correspond to the other bits except for the two most significant bits of the third image data 1030. In an embodiment, the processor 220 may acquire the second image frame 1005, based on the fifth image data 1050.

The processor 220 may acquire an HDR image through the first mode described in FIG. 9 or the second mode described in FIG. 10. When it is determined that the environment requires the HDR function, the processor 220 may determine that the environment corresponds to the first photographing environment or the second photographing environment, based on information regarding at least part of a set zoom magnification, an amount of noise included in an image, an exposure time of the image sensor 210. For example, the processor 220 may receive a user input for setting the zoom magnification, and, when the zoom magnification is higher than or equal to a designated magnification, the processor 220 may use the first mode, and, when the zoom magnification is less than the designated magnification, the processor 220 may use the second mode. Switching the photographing mode according to the zoom magnification is described below with reference to FIG. 14. In another example, when it is determined that an amount of noise included in the first image frame is greater than or equal to a predetermined level and thus the amount of noise should be reduced, the processor 220 may use the second mode. When the image sensor 210 uses the second mode, an amount of noise included in the second image frame 1005 may be reduced compared to the case where the first mode is used.

The processor 220 may acquire second light quantity data through a plurality of pixels (e.g., the unit pixel 214) during a second exposure time, in response to the photographing environment of the electronic device 100 corresponding to the second photographing environment. For example, when the second mode is used, the processor 220 may determine the exposure time of the image sensor 210 as a second exposure time. In an embodiment, the second exposure time may be longer than the first exposure time, and in another embodiment, the first exposure time and the second exposure time may be the same as each other or may have nothing to do with each other.

Figure 11:
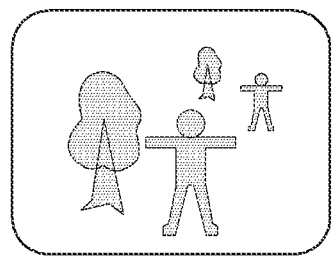
FIG. 11 is a view illustrating an example of acquiring an image in a third mode by the electronic device according to an embodiment of the disclosure.
Figure 11:
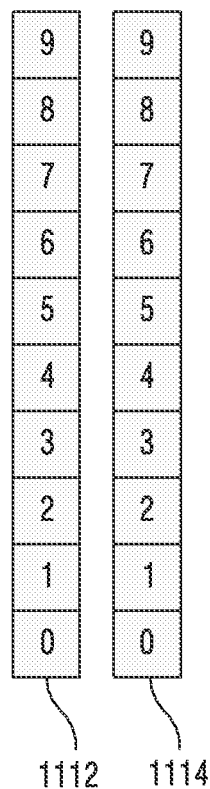

FIG. 11 is a view illustrating an example of acquiring an image in the third mode by an electronic device according to an embodiment of the disclosure.

Referring to FIG. 11, the processor 220 may photograph an image in the third mode by controlling the image sensor 210 in response to the photographing environment of the electronic device 100 corresponding to the third photographing environment. For example, the third mode may be a low luminance mode. The low luminance mode may be used when there is not much light in the ambient environment of the electronic device 100 and light information of a subject is less than a reference value.

The image sensor 210 may receive input of light quantity data to the individual pixel 212 or the unit pixel 214 during an exposure time.

The image sensor 210 may read out the light quantity data two or more times according to a first conversion gain, and may average. In the low luminance environment, there is not much light and thus data may be read out according to an HCG. For example, the image sensor 210 may acquire first image data 1112 and second image data 1114 by reading out the light quantity data two times through the same conversion gain (e.g., the first conversion gain) and the same sensitivity (e.g., the first sensitivity). For example, the first image data 1112 and the second image data 1114 may have a bit of a first number (e.g., 10), respectively. The first image data 1112 may be distinguished from the first image data 1010 of FIG. 10, and the second image data 1114 may be distinguished from the second image data 1020 of FIG. 10.

The image sensor 210 may acquire third image data by averaging the first image data 1112 and the second image data 1114. For example, the third image data may have the bit of the first number (for example, 10). The third image data may be distinguished from the third image data 1030 of FIG. 10. The image sensor 210 may provide the third image data acquired through the third mode to the processor 220. The processor 220 may acquire a second image frame based on the third image data.

The image sensor 210 can reduce a noise included in the image data through the process of reading out data inputted to the individual pixel 212 or the unit pixel 214 two or more times, and calculating an average.

FIG. 11 shows that the image sensor 210 acquires the first image data 1112 and the second image data 1114 by reading out data inputted to the individual pixel 212 or the unit pixel 214 two times, but this is one example and various embodiments are possible. For example, the processor 220 may calculate an average by reading out data inputted to the individual pixel 212 or the unit pixel 214 three times, or may calculate an average by reading out four or more times.

The image sensor 210 may perform a CDS operation when the third mode is used. The image sensor 210 may acquire reset data after performing a reset operation, and may acquire readout data corresponding to the light quantity data two times after switching the TG 320 to an on-state. For example, when the image sensor 210 reads out the light quantity data two times, the image sensor 210 may acquire first readout data, second readout data. The image sensor 210 may acquire the first image data 1112 based on a difference between the first readout data and the reset data, and may acquire the second image data 1114 based on a difference between the second readout data and the reset data. The image sensor 210 may average the first readout data and the second readout data, and then, may calculate a difference value with the reset data. When the image sensor 210 uses the third mode, three or more readouts may be required by considering CDS.

Figure 12:
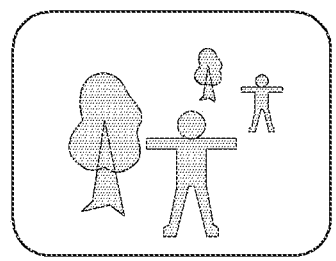
FIG. 12 is a view illustrating an example of acquiring an image in a fourth mode the electronic device according to an embodiment of the disclosure.
Figure 12:
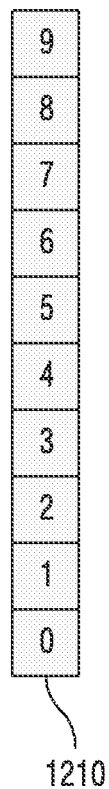

FIG. 12 is a view illustrating an example of acquiring an image in the fourth mode by an electronic device according to an embodiment of the disclosure.

Referring to FIG. 12, the processor 220 may photograph an image in the fourth mode by controlling the image sensor 210 in response to the photographing environment of the electronic device 100 corresponding to the fourth photographing environment. For example, the fourth mode may be a normal mode. The normal mode may be used when the ambient environment of the electronic device 100 is bright, light information of a subject is greater than or equal to a reference value, and the HDR function is not required.

The image sensor 210 may receive input of light quantity data to the individual pixel 212 or the unit pixel 214 during an exposure time.

For example, the image sensor 210 may acquire image data 1210 by reading out one time through a first conversion gain and first sensitivity, based on the light quantity data. For example, the image data 1210 may have a bit of a first number (e.g., 10). According to embodiment, the image sensor 210 may provide the image data 1210 to the processor 220. The processor 220 may acquire a second image frame based on the image data 1210.

The image sensor 210 may perform a CDS operation when the fourth mode is used. The image sensor 210 may acquire reset data after performing a reset operation, and may acquire readout data corresponding to the light quantity data after switching the TG 320 to an on-state. The image sensor 210 may acquire the image data 1210 based on a difference between the readout data and the reset data. When the image sensor 210 uses the fourth mode, two readouts may be required. When the image sensor 210 uses the fourth mode, power consumption may be lowest compared to the case where the first to third modes are used.

Figure 13:
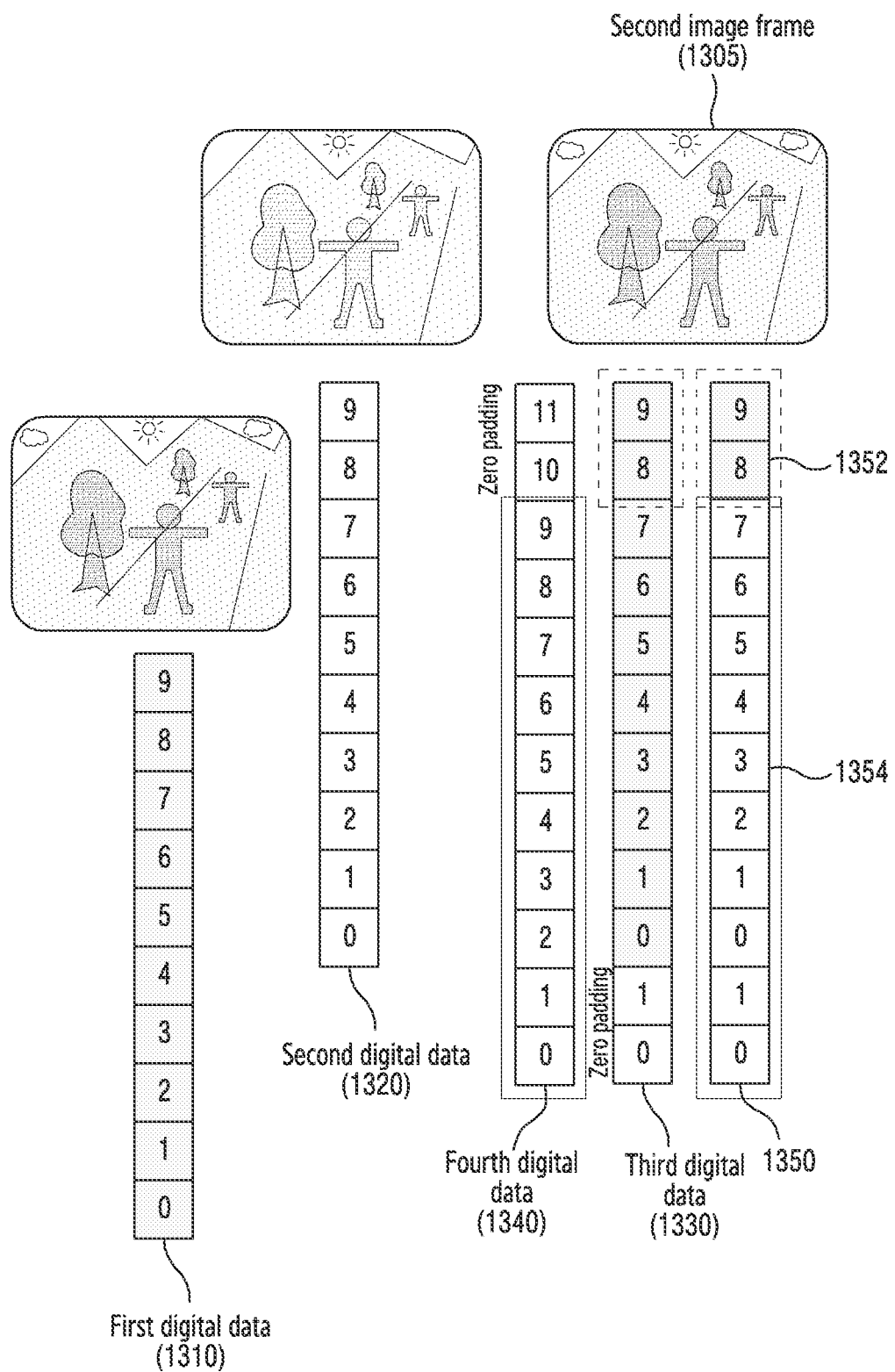
FIG. 13 is a view illustrating an example of acquiring an image in a third photographing environment by the electronic device according to an embodiment of the disclosure.

FIG. 13 illustrates an example of acquiring an image in the third photographing environment by an electronic device according to an embodiment of the disclosure.

Referring to FIG. 13, even when it is determined that the photographing environment of the electronic device 100 corresponds to the third photographing environment, the processor 220 may photograph an image through the first mode. For example, when it is determined that it is necessary to extend a DR of a predetermined area in a first image frame acquired from the image sensor 210, the processor 220 may acquire a second image frame through the first mode. The predetermined area may refer to an area that has brightness less than or equal to a reference value in the first image frame.

The image sensor 210 may acquire analog data through pixels. The image sensor 210 may acquire first digital data 1310 by digitally converting the analog data with first sensitivity two or more times, and averaging, and may acquire second digital data 1320 by digitally converting the analog data with second sensitivity two times and averaging. The operation of acquiring, by the processor 220, a second image frame 1305 based on the first digital data 1310 and the second digital data 1320 may correspond to the operation in FIG. 9 of acquiring the second image frame 905 based on the first digital data 910 and the second digital data 920. For example, third digital data 1330 may correspond to the third digital data 930 of FIG. 9, fourth digital data 1340 may correspond to the fourth digital data 940 of FIG. 9, the second image frame 1305 may correspond to the second image frame 905 of FIG. 9, and reference numerals 1305, 1352, and 1354 may correspond to reference numerals 950, 952, and 954 of FIG. 9, respectively.

The processor 220 may use the first mode in a case where a designated condition is satisfied, in addition to the case where an HDR image is required. For example, the processor 220 may use the first mode to reduce a noise in a low luminance environment. When a value of analog data acquired in the low luminance environment is less than or equal to a predetermined level, the processor 220 may reduce the noise through the operations of digitally converting with the first sensitivity two or more times and averaging, and digitally converting with the second sensitivity two or more times and averaging. Even when a noise of a predetermined level or higher is included in an image acquired through the first mode, the processor 220 may reduce the noise through the operation of reading out two or more times and then averaging as described in FIG. 13. The processor 220 may reduce a noise included in the first digital data 1310 or the second digital data 1320 by reading out the analog data with different sensitivity two or more times and averaging.

Figure 14:
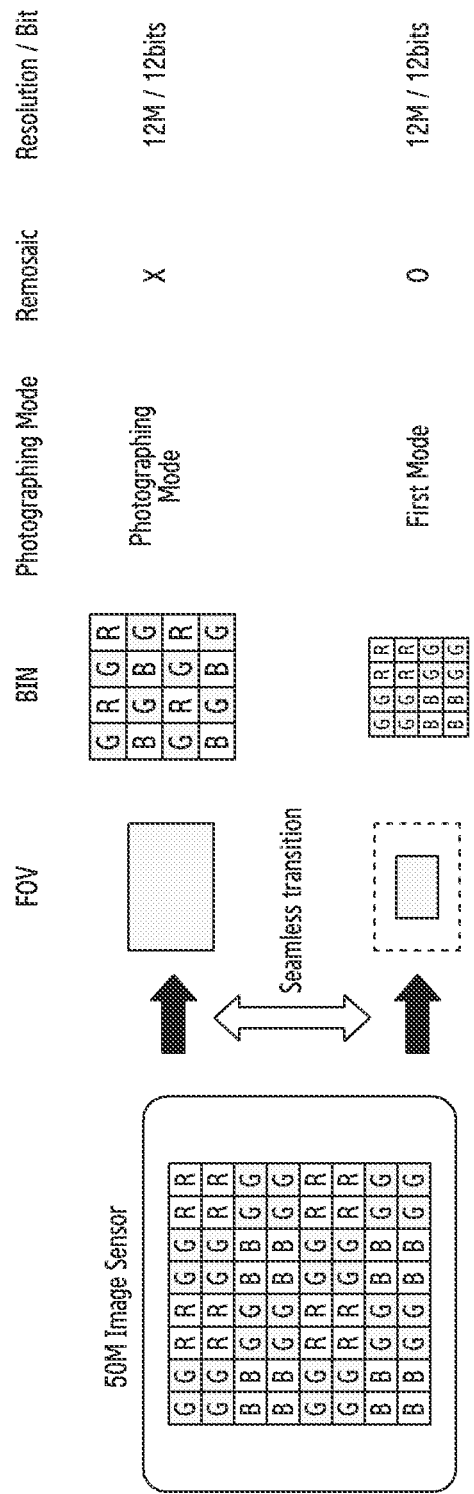
FIG. 14 is a view illustrating an example of changing a photographing mode according to a set zoom magnification by the electronic device according to an embodiment of the disclosure.

FIG. 14 illustrates an example of changing a photographing mode according to a set zoom magnification by an electronic device according to an embodiment of the disclosure.

Referring to FIG. 14, the electronic device 100 may include an image sensor 210 having 50-mega pixels. For example, the image sensor 210 may include unit pixels 214 each including four (4) PDs having an arrangement of 2×2. The unit pixel 214 may be understood as a color filter unit.

For example, four (4) individual pixels 212 corresponding to red (R) of the color filter may be included in a single unit pixel 214.

The processor 220 may also consider a zoom magnification when determining whether the photographing environment of the electronic device 100 corresponds to a designated photographing environment. When it is determined that an HDR function is required, the processor 220 may determine whether the photographing environment is the first photographing environment or the second photographing environment, based on the zoom magnification. For example, the processor 220 may receive a user input of setting the zoom magnification or may determine the zoom magnification through an application using the image sensor 210. When the zoom magnification is higher than or equal to a designated magnification, the processor 220 may determine that the photographing environment is the first photographing environment, and, when the zoom magnification is less than the designated magnification, the processor 220 may determine that the photographing environment is the second photographing environment. The processor 220 may determine a field of view (FOV), whether to perform binning, a photographing mode, whether to perform remosaic, a resolution, and the number of bits of image data (or digital data), based on the photographing environment.

The FOV of the camera module 180 may be determined according to the zoom magnification. For example, the processor 220 may acquire an image in which some areas are cropped from an image area acquired through the image sensor 210 to correspond to the zoom magnification. As the zoom magnification increases, the FOV may be reduced. When the zoom magnification is higher than or equal to the designated magnification, the processor 220 may not perform binning and may acquire an image based on light quantity data acquired through the respective individual pixels 212. In addition, when the zoom magnification is higher than or equal to the designated magnification, the processor 220 may determine that remosaic is required.

When the processor 220 uses the second mode, it may be advantageous to acquire an image based on a quantity of electric charges acquired through the unit pixel 214. When the processor 220 uses the second mode, the size of the FD storage space increases as much as the FD1 735. Therefore, it may be advantageous to acquire an image by using light quantity data acquired through the unit pixel 214 (for example, four (4) PDs), rather than using light quantity data acquired through the respective individual pixels 212 (for example, a single PD). When the processor 220 uses the first mode, it may be advantageous to acquire an image based on a quantity of electric charges acquired from every individual pixel 212, compared to the case where the second mode is used. When the processor 220 uses the first mode, the size of the FD storage space does not increase as much as the FD1 735. Therefore, it may be advantageous to acquire an image by using light quantity data acquired through the respective individual pixels 212 (for example, a single PD).

When the zoom magnification is less than the designated magnification, the processor 220 may determine the photographing mode as the second mode since the FOV is wide and binning is performed. In addition, when the zoom magnification is higher than or equal to the designated magnification, the processor 220 may determine the photographing mode as the first mode since the FOV is narrow and binning is not performed. The processor 220 may perform binning when an image of a wide FOV is acquired, and may not perform binning when an image of a narrow FOV is acquired. Therefore, a resolution of an image acquired by the processor 220 through the first mode and a resolution of an image acquired through the second mode may be 12-mega pixels which are constant. In addition, the number of bits of digital data acquired by the processor 220 through the first mode, and the number of bits of image data acquired through the second mode may be 12 which is constant.

Even when the zoom magnification is changed while the HDR image is being acquired in the electronic device 100 according to an embodiment, digital data acquired through the first mode and image data acquired through the second mode may have the constant number of bits and the constant resolution. Therefore, there may be no interruption in the flow of data. For example, a preview image displayed on the display 110 may be provided without interruption. In another example, even when a user changes a zoom magnification in the middle of receiving an HDR image by using the electronic device 100, the electronic device 100 may continue photographing without interruption.

Figure 15:
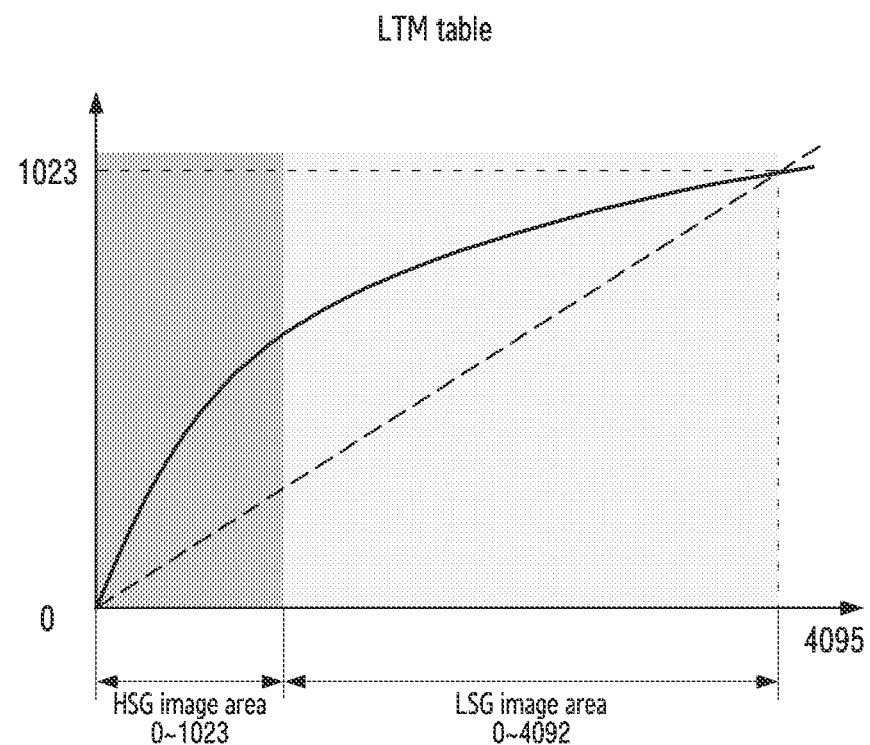
FIG. 15 is a view illustrating an example of acquiring a HDR image based on two or more images which are acquired through the image sensor by the electronic device according to an embodiment of the disclosure.

FIG. 15 illustrates an example of acquiring an HDR image based on two or more images acquired by the electronic device 100 through the image sensor according to an embodiment of the disclosure.

Referring to FIG. 15, the processor 220 may acquire an image frame (e.g., the second image frame 905 of FIG. 9), based on first digital data (e.g., the first digital data 910 of FIG. 9) and second digital data (e.g., the second digital data 920 of FIG. 9) acquired through the first mode. A DR of the image frame may be wider than a DR of the first digital data or a DR of the second digital data. FIG. 15 illustrates one example in which the processor 220 acquires an image frame which is an HDR image, based on the first digital data and the second digital data.

The processor 220 may perform local tone mapping (LTM) calculation with respect to the first digital data and the second digital data. The graph of FIG. 15 may be a graph which is pre-designated in the electronic device 100. The processor 220 may input the first digital data and the second digital data to the x-axis, and may acquire the image frame based on a corresponding y value. The graph of FIG. 15 is merely one example and various embodiments implementable by those skilled in the art are possible. For example, the processor 220 may perform image fusion through a graph having a different curvature from the curvature illustrated in FIG. 15.

According to an embodiment of the disclosure, an electronic device may include: an image sensor including a plurality of unit pixels, each unit pixel including two or more individual pixels; and at least one processor electrically connected with the image sensor The at least one processor may be configured to: acquire a first image frame from the image sensor; determine whether a photographing environment of the electronic device corresponds to a designated photographing environment, based on the first image frame; in response to the photographing environment corresponding to a first photographing environment: control the image sensor to acquire analog data through the individual pixels, and to provide first digital data digitally converted from the analog data with first sensitivity by the image sensor, and second digital data digitally converted from the analog data with second sensitivity which is higher than the first sensitivity, to the at least one processor; and acquire a second image frame which follows the first image frame, based on the first digital data and the second digital data; and, in response to the photographing environment corresponding to a second photographing environment: control the image sensor to provide first image data which is acquired according to a first conversion gain, based on light quantity data inputted to the unit pixel, and second image data which is acquired according to a second conversion gain lower than the first conversion gain, based on the light quantity data, to the at least one processor; and acquire the second image frame based on the first image data and the second image data.

In the electronic device, in response to the photographing environment corresponding to a third photographing environment, the at least one processor may control the image sensor to provide third image data which is acquired by reading out the light quantity data inputted to the individual pixel or the unit pixel according to the first conversion gain two or more times, and averaging, to the at least one processor, and may acquire the second image frame based on the third image data.

In the electronic device, in response to the photographing environment corresponding to a fourth photographing environment, the at least one processor may control the image sensor to provide fourth image data which is acquired by performing correlated double sampling (CDS) based on the light quantity data inputted to the individual pixel or the unit pixel, to the at least one processor, and may acquire the second image frame based on the fourth image data.

In the electronic device, the at least one processor may determine whether the photographing environment corresponds to the designated photographing environment, based on at least one of whether a scene corresponding to the first image frame is made by backlight, ambient illuminance of the electronic device, or whether a person is included in a subject of the first image frame.

In the electronic device, the at least one processor may receive a unit input for setting a zoom magnification, when the zoom magnification is greater than or equal to a designated zoom magnification, may determine that the photographing environment is the first photographing environment; and, when the zoom magnification is less than the designated zoom magnification, may determine that the photographing environment is the second photographing environment.

In the electronic device, the at least one processor may, in response to the photographing environment corresponding to the first photographing environment, acquire first light quantity data through the individual pixel during a first exposure time, and, in response to the photographing environment corresponding to the second photographing environment, may acquire second light quantity data through the unit pixel during a second exposure time which is longer than the first exposure time.

In the electronic device, when the photographing environment corresponds to the first photographing environment, the at least one processor may acquire third digital data having a bit of a third number by adding first dummy data having a bit of a second number to the first digital data having a bit of a first number, may acquire fourth digital data having the bit of the third number by adding second dummy data having the bit of the second number to the second digital data having the bit of the first number, and may acquire the second image frame based on the third digital data and the fourth digital data.

In the electronic device, the first number may be 10, the second number may be 2, and the third number may be 12.

In the electronic device, the at least one processor may add the first dummy data to the first digital data through least significant bit (LSB) zero padding, and may add the second dummy data to the second digital data through most significant bit (MSB) zero padding.

In the electronic device, the image sensor may include at least one analog digital converter (ADC) configured to digitally convert the analog data into the first digital data and the second digital data.

In the electronic device, the unit pixel may include four individual pixels.

According to an embodiment of the disclosure, an electronic device may include: an image sensor including a plurality of pixels and at least one ADC; and at least one processor electrically connected with the image sensor. The at least one processor may be configured to: control the image sensor to acquire analog data through the pixels, and to provide first digital data which is digitally converted from the analog data with first sensitivity by the image sensor through the at least one ADC, and second digital data which is digitally converted from the analog data with second sensitivity higher than the first sensitivity through the at least one ADC, to the at least one processor; acquire the first digital data and the second digital data from the image sensor; and acquire a first image frame based on the first digital data and the second digital data.

In the electronic device, the at least one processor may acquire third digital data by adding first dummy data having a bit of a second number to the first digital data having a bit of a first number, may acquire fourth digital data by adding second dummy data having the bit of the second number to the second digital data having the bit of the first number, and may acquire the first image frame, based on the third digital data and the fourth digital data.

In the electronic device, the at least one ADC may include a first ADC and a second ADC, and the image sensor may digitally convert the analog data with the first sensitivity through the first ADC, and may digitally convert the analog data with the second sensitivity through the second ADC.

In the electronic device, the image sensor may include a single ADC, and the image sensor may digitally convert the analog data with the first sensitivity through the single ADC at a first time, and may digitally convert the analog data with the second sensitivity through the single ADC at a second time which follows the first time.

In the electronic device, the image sensor may include a unit pixel including four (4) photo diodes (PDs) having an arrangement of 2×2, and a single floating diffusion (FD) connected with the four (4) PDs.

In the electronic device, the image sensor may acquire the analog data based on light quantity data which is acquired through any one PD of the four (4) PDs.

In the electronic device, the image sensor may acquire the analog data based on light quantity data which is acquired through at least two PDs of the four (4) PDs.

In the electronic device, each pixel of the plurality of pixels may include a single PD and a single FD. The image sensor may acquire the analog data based on light quantity data which is acquired through the PD.

In the electronic device, in response to it being determined that a photographing environment of the electronic device corresponds to a designated photographing environment, the at least one processor may control the image sensor to provide the first digital data which is acquired by digitally converting the analog data with the first sensitivity two or more times and averaging, and the second digital data which is acquired by digitally converting the analog data with the second sensitivity two or more times and averaging, to the at least one processor.

Figure 16:
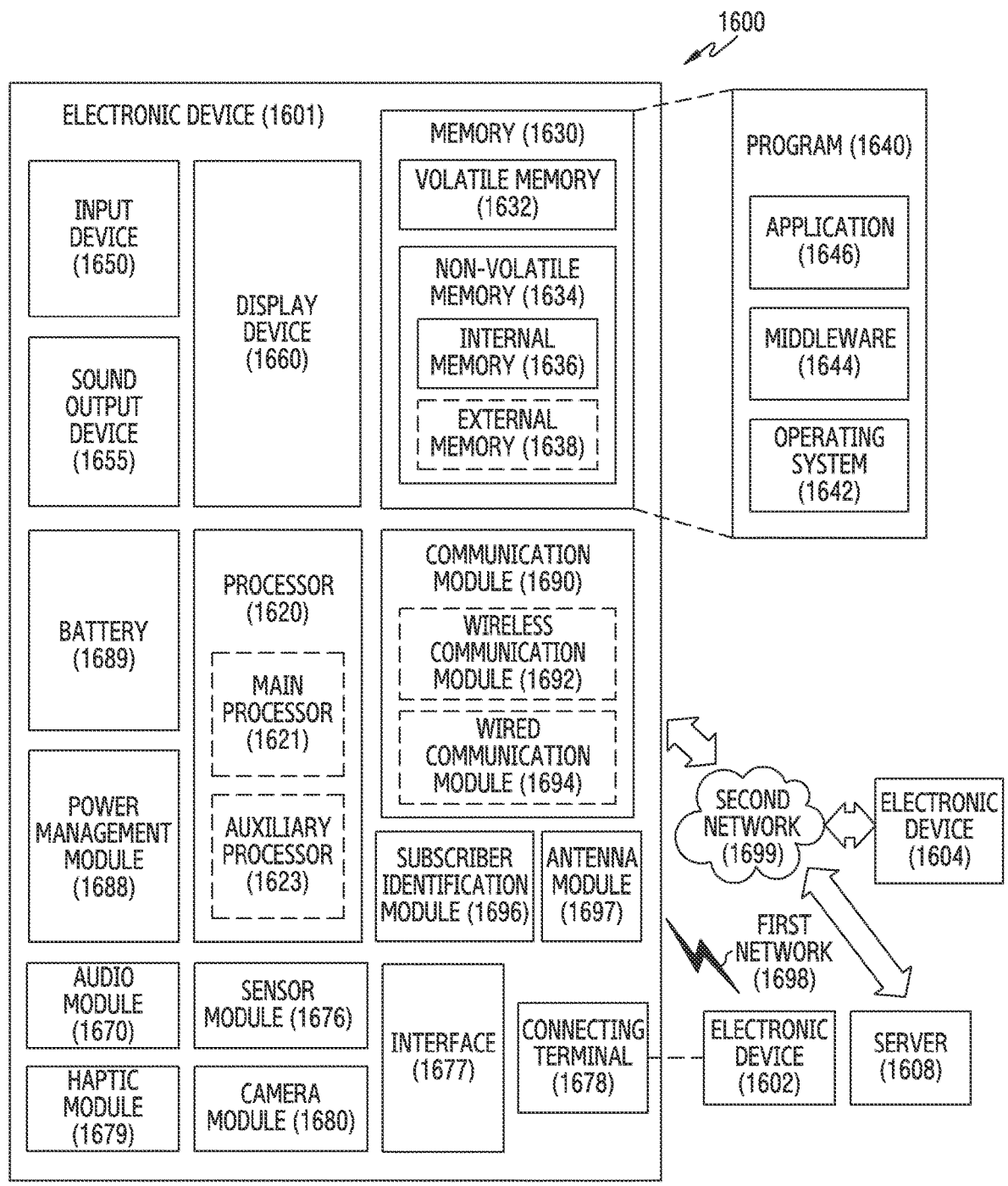
FIG. 16 is a block diagram of an electronic device in a network environment according to an embodiment of the disclosure.

FIG. 16 is a block diagram illustrating an electronic device 1601 in a network environment 1600 according to an embodiment of the disclosure.

Referring to FIG. 16, the electronic device 1601 in the network environment 1600 may communicate with an electronic device 1602 via a first network 1698 (e.g., a short-range wireless communication network), or at least one of an electronic device 1604 or a server 1608 via a second network 1699 (e.g., a long-range wireless communication network). The electronic device 1601 may communicate with the electronic device 1604 via the server 1608. The electronic device 1601 may include a processor 1620, memory 1630, an input module 1650, a sound output module 1655, a display module 1660, an audio module 1670, a sensor module 1676, an interface 1677, a connecting terminal 1678, a haptic module 1679, a camera module 1680, a power management module 1688, a battery 1689, a communication module 1690, a subscriber identification module (SIM) 1696, or an antenna module 1697. In some embodiments, at least one of the components (e.g., the connecting terminal 1678) may be omitted from the electronic device 1601, or one or more other components may be added in the electronic device 1601. In some embodiments, some of the components (e.g., the sensor module 1676, the camera module 1680, or the antenna module 1697) may be implemented as a single component (e.g., the display module 1660).

The processor 1620 may execute, software (e.g., a program 1640) to control at least one other component (e.g., a hardware or software component) of the electronic device 1601 coupled with the processor 1620, and may perform various data processing or computation. As at least part of the data processing or computation, the processor 1620 may store a command or data received from another component (e.g., the sensor module 1676 or the communication module 1690) in volatile memory 1632, process the command or the data stored in the volatile memory 1632, and store resulting data in non-volatile memory 1634. The processor 1620 may include a main processor 1621 (e.g., a central processing unit (CPU) or an application processor (AP)), or an auxiliary processor 1623 (e.g., a graphics processing unit (GPU), a neural processing unit (NPU), an image signal processor (ISP), a sensor hub processor, or a communication processor (CP)) that is operable independently from, or in conjunction with, the main processor 1621. For example, when the electronic device 1601 includes the main processor 1621 and the auxiliary processor 1623, the auxiliary processor 1623 may be adapted to consume less power than the main processor 1621, or to be specific to a specified function. The auxiliary processor 1623 may be implemented as separate from, or as part of the main processor 1621.

The auxiliary processor 1623 may control at least some of functions or states related to at least one component (e.g., the display module 1660, the sensor module 1676, or the communication module 1690) among the components of the electronic device 1601, instead of the main processor 1621 while the main processor 1621 is in an inactive (e.g., sleep) state, or together with the main processor 1621 while the main processor 1621 is in an active state (e.g., executing an application). The auxiliary processor 1623 (e.g., an image signal processor or a communication processor) may be implemented as part of another component (e.g., the camera module 1680 or the communication module 1690) functionally related to the auxiliary processor 1623. The auxiliary processor 1623 (e.g., the neural processing unit) may include a hardware structure specified for artificial intelligence model processing. An artificial intelligence model may be generated by machine learning. Such learning may be performed, e.g., by the electronic device 1601 where the artificial intelligence is performed or via a separate server (e.g., the server 1608). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 1630 may store various data used by at least one component (e.g., the processor 1620 or the sensor module 1676) of the electronic device 1601. The various data may include, for example, software (e.g., the program 1640) and input data or output data for a command related thereto. The memory 1630 may include the volatile memory 1632 or the non-volatile memory 1634.

The program 1640 may be stored in the memory 1630 as software, and may include, for example, an operating system (OS) 1642, middleware 1644, or an application 1646.

The input module 1650 may receive a command or data to be used by another component (e.g., the processor 1620) of the electronic device 1601, from the outside (e.g., a user) of the electronic device 1601. The input module 1650 may include, for example, a microphone, a mouse, a keyboard, a key (e.g., a button), or a digital pen (e.g., a stylus pen).

The sound output module 1655 may output sound signals to the outside of the electronic device 1601. The sound output module 1655 may include, for example, a speaker or a receiver. The speaker may be used for general purposes, such as playing multimedia or playing record. The receiver may be used for receiving incoming calls. The receiver may be implemented as separate from, or as part of the speaker.

The display module 1660 may visually provide information to the outside (e.g., a user) of the electronic device 1601. The display module 1660 may include, for example, a display, a hologram device, or a projector and control circuitry to control a corresponding one of the display, hologram device, and projector. The display module 1660 may include a touch sensor adapted to detect a touch, or a pressure sensor adapted to measure the intensity of force incurred by the touch.

The audio module 1670 may convert a sound into an electrical signal and vice versa. The audio module 1670 may obtain the sound via the input module 1650, or output the sound via the sound output module 1655 or a headphone of an external electronic device (e.g., an electronic device 1602) directly (e.g., wiredly) or wirelessly coupled with the electronic device 1601.

The sensor module 1676 may detect an operational state (e.g., power or temperature) of the electronic device 1601 or an environmental state (e.g., a state of a user) external to the electronic device 1601, and then generate an electrical signal or data value corresponding to the detected state. The sensor module 1676 may include a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1677 may support one or more specified protocols to be used for the electronic device 1601 to be coupled with the external electronic device (e.g., the electronic device 1602) directly (e.g., wiredly) or wirelessly. The interface 1677 may include a high definition multimedia interface (HDMI), a universal serial bus (USB) interface, a secure digital (SD) card interface, or an audio interface.

A connecting terminal 1678 may include a connector via which the electronic device 1601 may be physically connected with the external electronic device (e.g., the electronic device 1602). The connecting terminal 1678 may include a HDMI connector, a USB connector, a SD card connector, or an audio connector (e.g., a headphone connector).

The haptic module 1679 may convert an electrical signal into a mechanical stimulus (e.g., a vibration or a movement) or electrical stimulus which may be recognized by a user via his tactile sensation or kinesthetic sensation. The haptic module 1679 may include a motor, a piezoelectric element, or an electric stimulator.

The camera module 1680 may capture a still image or moving images. The camera module 1680 may include one or more lenses, image sensors, image signal processors, or flashes.

The power management module 1688 may manage power supplied to the electronic device 1601. The power management module 1688 may be implemented as at least part of, for example, a power management integrated circuit (PMIC).

The battery 1689 may supply power to at least one component of the electronic device 1601. The battery 1689 may include, for example, a primary cell which is not rechargeable, a secondary cell which is rechargeable, or a fuel cell.

The communication module 1690 may support establishing a direct (e.g., wired) communication channel or a wireless communication channel between the electronic device 1601 and the external electronic device (e.g., the electronic device 1602, the electronic device 1604, or the server 1608) and performing communication via the established communication channel. The communication module 1690 may include one or more communication processors that are operable independently from the processor 1620 (e.g., the application processor (AP)) and supports a direct (e.g., wired) communication or a wireless communication. The communication module 1690 may include a wireless communication module 1692 (e.g., a cellular communication module, a short-range wireless communication module, or a global navigation satellite system (GNSS) communication module) or a wired communication module 1694 (e.g., a local area network (LAN) communication module or a power line communication (PLC) module). A corresponding one of these communication modules may communicate with the external electronic device via the first network 1698 (e.g., a short-range communication network, such as Bluetooth™, wireless-fidelity (Wi-Fi) direct, or infrared data association (IrDA)) or the second network 1699 (e.g., a long-range communication network, such as a legacy cellular network, a $5^{th}$ generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1692 may identify and authenticate the electronic device 1601 in a communication network, such as the first network 1698 or the second network 1699, using subscriber information (e.g., international mobile subscriber identity (IMSI)) stored in the subscriber identification module 1696.

The wireless communication module 1692 may support a 5G network, after a $4^{th}$ generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 1692 may support a high-frequency band (e.g., the mm Wave band) to achieve, e.g., a high data transmission rate. The wireless communication module 1692 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 1692 may support various requirements specified in the electronic device 1601, an external electronic device (e.g., the electronic device 1604), or a network system (e.g., the second network 1699). The wireless communication module 1692 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 1697 may transmit or receive a signal or power to or from the outside (e.g., the external electronic device) of the electronic device 1601. According to an embodiment, the antenna module 1697 may include an antenna including a radiating element composed of a conductive material or a conductive pattern formed in or on a substrate (e.g., a printed circuit board (PCB)). The antenna module 1697 may include a plurality of antennas (e.g., array antennas). In such a case, at least one antenna appropriate for a communication scheme used in the communication network, such as the first network 1698 or the second network 1699, may be selected, for example, by the communication module 1690 (e.g., the wireless communication module 1692) from the plurality of antennas. The signal or the power may then be transmitted or received between the communication module 1690 and the external electronic device via the selected at least one antenna. According to an embodiment, another component (e.g., a radio frequency integrated circuit (RFIC)) other than the radiating element may be additionally formed as part of the antenna module 1697.

The antenna module 1697 may form a mmWave antenna module. The mm Wave antenna module may include a printed circuit board, a RFIC disposed on a first surface (e.g., the bottom surface) of the printed circuit board, or adjacent to the first surface and capable of supporting a designated high-frequency band (e.g., the mm Wave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 1601 and the external electronic device 1604 via the server 1608 coupled with the second network 1699. Each of the electronic devices 1602 or 1604 may be a device of a same type as, or a different type, from the electronic device 1601. All or some of operations to be executed at the electronic device 1601 may be executed at one or more of the external electronic devices 1602, 1604, or 1608. For example, if the electronic device 1601 should perform a function or a service automatically, or in response to a request from a user or another device, the electronic device 1601, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1601. The electronic device 1601 may provide the outcome, with or without further processing of the outcome, as at least part of a reply to the request. To that end, a cloud computing, distributed computing, mobile edge computing (MEC), or client-server computing technology may be used. The electronic device 1601 may provide ultra low-latency services using, e.g., distributed computing or mobile edge computing. In another embodiment, the external electronic device 1604 may include an internet-of-things (IoT) device. The server 1608 may be an intelligent server using machine learning and/or a neural network. The external electronic device 1604 or the server 1608 may be included in the second network 1699. The electronic device 1601 may be applied to intelligent services (e.g., smart home, smart city, smart car, or healthcare) based on 5G communication technology or IoT-related technology.

The electronic device according to various embodiments of the disclosure may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments of the disclosure as set forth herein may be implemented as software (e.g., the program 1640) including one or more instructions that are stored in a storage medium (e.g., internal memory 1636 or external memory 1638) that is readable by a machine (e.g., the electronic device 1601). For example, a processor (e.g., the processor 1620) of the machine (e.g., the electronic device 1601) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities, and some of the multiple entities may be separately disposed in different components. One or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 17:
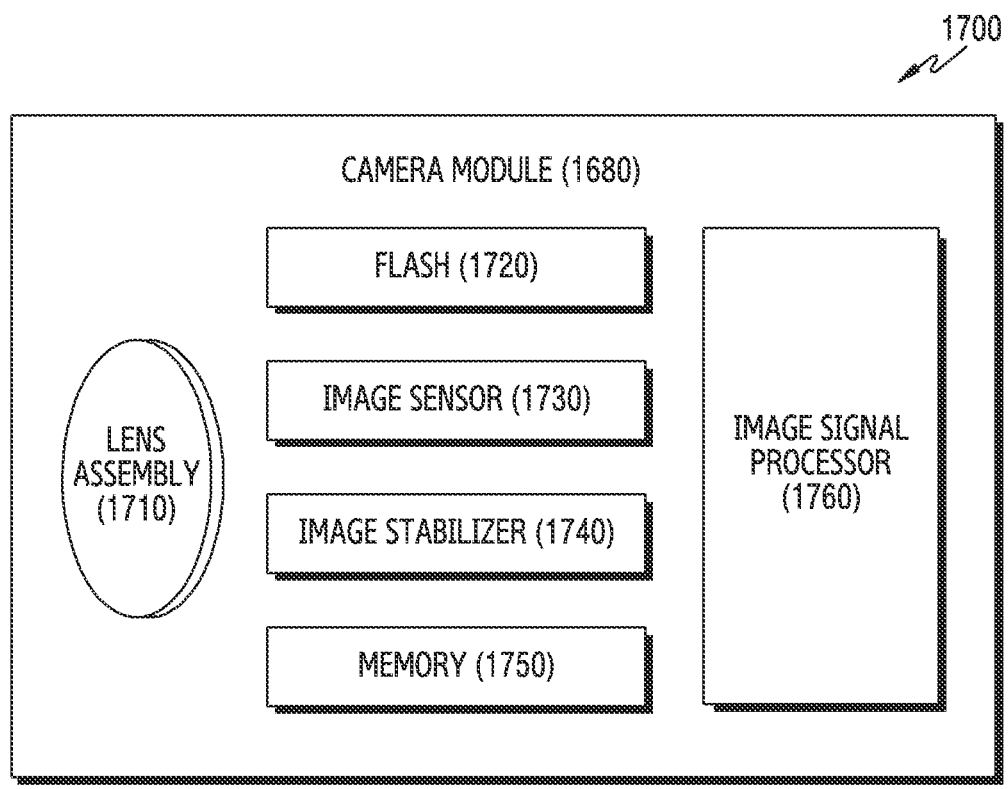
FIG. 17 is a block diagram illustrating a camera module according to an embodiment of the disclosure.

FIG. 17 is a block diagram 1700 illustrating the camera module 1680 according to an embodiment of the disclosure.

Referring to FIG. 17, the camera module 1680 may include a lens assembly 1710, a flash 1720, an image sensor 1730, an image stabilizer 1740, memory 1750 (e.g., buffer memory), or an image signal processor 1760. The lens assembly 1710 may collect light emitted or reflected from an object whose image is to be taken. The lens assembly 1710 may include one or more lenses. The camera module 1680 may include a plurality of lens assemblies 1710. In such a case, the camera module 1680 may form, for example, a dual camera, a 360-degree camera, or a spherical camera. Some of the plurality of lens assemblies 1710 may have the same lens attribute (e.g., view angle, focal length, auto-focusing, f number, or optical zoom), or at least one lens assembly may have one or more lens attributes different from those of another lens assembly. The lens assembly 1710 may include, for example, a wide-angle lens or a telephoto lens.

The flash 1720 may emit light that is used to reinforce light reflected from an object. The flash 1720 may include one or more light emitting diodes (LEDs) (e.g., a red-green-blue (RGB) LED, a white LED, an infrared (IR) LED, or an ultraviolet (UV) LED) or a xenon lamp. The image sensor 1730 may obtain an image corresponding to an object by converting light emitted or reflected from the object and transmitted via the lens assembly 1710 into an electrical signal. The image sensor 1730 may include one selected from image sensors having different attributes, such as an RGB sensor, a black-and-white (BW) sensor, an IR sensor, or a UV sensor, a plurality of image sensors having the same attribute, or a plurality of image sensors having different attributes. Each image sensor included in the image sensor 1730 may be implemented using, for example, a charged coupled device (CCD) sensor or a complementary metal oxide semiconductor (CMOS) sensor.

The image stabilizer 1740 may move the image sensor 1730 or at least one lens included in the lens assembly 1710 in a particular direction, or control an operational attribute (e.g., adjust the read-out timing) of the image sensor 1730 in response to the movement of the camera module 1680 or the electronic device 1601 including the camera module 1680. This allows compensating for at least part of a negative effect (e.g., image blurring) by the movement on an image being captured. The image stabilizer 1740 may sense such a movement by the camera module 1680 or the electronic device 1601 using a gyro sensor (not shown) or an acceleration sensor (not shown) disposed inside or outside the camera module 1680. The image stabilizer 1740 may be implemented, for example, as an optical image stabilizer.

The memory 1750 may store, at least temporarily, at least part of an image obtained via the image sensor 1730 for a subsequent image processing task. For example, if image capturing is delayed due to shutter lag or multiple images are quickly captured, a raw image obtained (e.g., a Bayer-patterned image, a high-resolution image) may be stored in the memory 1750, and its corresponding copy image (e.g., a low-resolution image) may be previewed via the display module 1660. Thereafter, if a specified condition is met (e.g., by a user's input or system command), at least part of the raw image stored in the memory 1750 may be obtained and processed, for example, by the image signal processor 1760. The memory 1750 may be configured as at least part of the memory 1630 or as a separate memory that is operated independently from the memory 1630.

The image signal processor 1760 may perform one or more image processing with respect to an image obtained via the image sensor 1730 or an image stored in the memory 1750. The one or more image processing may include, for example, depth map generation, three-dimensional (3D) modeling, panorama generation, feature point extraction, image synthesizing, or image compensation (e.g., noise reduction, resolution adjustment, brightness adjustment, blurring, sharpening, or softening). Additionally or alternatively, the image signal processor 1760 may perform control (e.g., exposure time control or read-out timing control) with respect to at least one (e.g., the image sensor 1730) of the components included in the camera module 1680. An image processed by the image signal processor 1760 may be stored back in the memory 1750 for further processing, or may be provided to an external component (e.g., the memory 1630, the display module 1660, the electronic device 1602, the electronic device 1604, or the server 1608) outside the camera module 1680. The image signal processor 1760 may be configured as at least part of the processor 1620, or as a separate processor that is operated independently from the processor 1620. If the image signal processor 1760 is configured as a separate processor from the processor 1620, at least one image processed by the image signal processor 1760 may be displayed, by the processor 1620, via the display module 1660 as it is or after being further processed.

According to an embodiment of the disclosure, the electronic device 1601 may include a plurality of camera modules 1680 having different attributes or functions. In such a case, at least one of the plurality of camera modules 1680 may form, for example, a wide-angle camera and at least another of the plurality of camera modules 1680 may form a telephoto camera. Similarly, at least one of the plurality of camera modules 1680 may form, for example, a front camera and at least another of the plurality of camera modules 1680 may form a rear camera.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:

1. An electronic device comprising:
   an image sensor comprising a plurality of unit pixels, each unit pixel comprising two or more individual pixels;
   at least one processor electrically connected with the image sensor; and
   memory storing instructions, being executed by the at least one processor, cause the electronic device to:
   acquire a first image frame from the image sensor,
   determine whether a photographing environment of the electronic device corresponds to a designated photographing environment, based on the first image frame,
   in response to the photographing environment corresponding to a first photographing environment:
   control the image sensor to acquire analog data through the individual pixels and to provide first digital data and second digital data to the at least one processor, wherein the first digital data is digitally converted from the analog data with first sensitivity by the image sensor, and second digital data digitally converted from the analog data with second sensitivity which is higher than the first sensitivity by the image sensor; and
   acquire a second image frame following the first image frame, based on the first digital data and the second digital data, and
   in response to the photographing environment corresponding to a second photographing environment:
   control the image sensor to provide first image data and second image data to the at least one processor, wherein the first image data is acquired according to a first conversion gain based on light quantity data inputted to the unit pixel, and second image data is acquired according to a second conversion gain lower than the first conversion gain based on the light quantity data, and acquire the second image frame based on the first image data and the second image data.

2. The electronic device of claim 1, wherein, in response to the photographing environment corresponding to a third photographing environment, the instructions, being executed by the at least one processor, further cause the electronic device to:

control the image sensor to provide third image data which is acquired by reading out the light quantity data inputted to the individual pixel or the unit pixel according to the first conversion gain two or more times, and averaging, to the at least one processor; and acquire the second image frame based on the third image data.

3. The electronic device of claim 1, wherein, in response to the photographing environment corresponding to a fourth photographing environment, the instructions, being executed by the at least one processor, further cause the electronic device to:

control the image sensor to provide fourth image data which is acquired by performing correlated double sampling (CDS) based on the light quantity data inputted to the individual pixel or the unit pixel, to the at least one processor; and acquire the second image frame based on the fourth image data.

4. The electronic device of claim 1, wherein the instructions, being executed by the at least one processor, further cause the electronic device to determine whether the photographing environment corresponds to the designated photographing environment, based on at least one of whether a scene corresponding to the first image frame is made by backlight, ambient illuminance of the electronic device, or whether a person is included in a subject of the first image frame.

5. The electronic device of claim 1, wherein the instructions, being executed by the at least one processor, further cause the electronic device to:

receive a unit input for setting a zoom magnification, when the zoom magnification is greater than or equal to a designated zoom magnification, determine that the photographing environment is the first photographing environment, and when the zoom magnification is less than the designated zoom magnification, determine that the photographing environment is the second photographing environment.

6. The electronic device of claim 1, wherein the instructions, being executed by the at least one processor, further cause the electronic device to:

in response to the photographing environment corresponding to the first photographing environment, acquire first light quantity data through the individual pixel during a first exposure time, and in response to the photographing environment corresponding to the second photographing environment, acquire second light quantity data through the unit pixel during a second exposure time which is longer than the first exposure time.

7. The electronic device of claim 1, wherein, when the photographing environment corresponds to the first photographing environment, the instructions, being executed by the at least one processor, further cause the electronic device to:

acquire third digital data having a bit of a third number by adding first dummy data having a bit of a second number to the first digital data having a bit of a first number, acquire fourth digital data having the bit of the third number by adding second dummy data having the bit of the second number to the second digital data having the bit of the first number, and acquire the second image frame based on the third digital data and the fourth digital data.

8. The electronic device of claim 7, wherein the first number is 10, the second number is 2, and the third number is 12.

9. The electronic device of claim 7, wherein the instructions, being executed by the at least one processor, further cause the electronic device to:

add the first dummy data to the first digital data through least significant bit (LSB) zero padding; and add the second dummy data to the second digital data through most significant bit (MSB) zero padding.

10. The electronic device of claim 1, wherein the image sensor comprises at least one analog digital converter (ADC) configured to digitally convert the analog data into the first digital data and the second digital data.

11. The electronic device of claim 1, wherein the unit pixel comprises four individual pixels.

12. An electronic device comprising:

an image sensor comprising a plurality of pixels and at least one analog digital converter (ADC);

at least one processor electrically connected with the image sensor; and memory storing instructions, being executed by the at least one processor, cause the electronic device to:

control the image sensor to acquire analog data through the pixels, and to provide first digital data and second digital data to the at least one processor, wherein the first digital data is digitally converted from the analog data with first sensitivity by the image sensor through the at least one ADC, and the second digital data is digitally converted from the analog data with second sensitivity higher than the first sensitivity by the image sensor through the at least one ADC, acquire the first digital data and the second digital data from the image sensor, and acquire a first image frame based on the first digital data and the second digital data, and acquire a second image frame based on a portion of the first digital data corresponding to a first area and a portion of the second digital data corresponding to a second area, wherein the first area and the second area are determined based on brightness of the first image frame.

13. The electronic device of claim 12, wherein the instructions, being executed by the at least one processor, further cause the electronic device to:

acquire third digital data by adding first dummy data having a bit of a second number to the first digital data having a bit of a first number;

acquire fourth digital data by adding second dummy data having the bit of the second number to the second digital data having the bit of the first number; and acquire the first image frame, based on the third digital data and the fourth digital data.

14. The electronic device of claim 12, wherein the at least one ADC comprises a first ADC and a second ADC, and wherein the image sensor is configured to:

digitally convert the analog data with the first sensitivity through the first ADC, and digitally convert the analog data with the second sensitivity through the second ADC.

15. The electronic device of claim 12, wherein the image sensor comprises a single ADC, and wherein the image sensor is configured to:

digitally convert the analog data with the first sensitivity through the single ADC at a first time, and digitally convert the analog data with the second sensitivity through the single ADC at a second time which follows the first time.

16. The electronic device of claim 12, wherein the image sensor comprises a unit pixel comprising:

four (4) photo diodes (PDs) having an arrangement of 2×2; and a single floating diffusion (FD) connected with the four (4) PDs.

17. The electronic device of claim 16, wherein the image sensor is configured to acquire the analog data based on light quantity data which is acquired through any one PD of the four (4) PDs.

18. The electronic device of claim 16, wherein the image sensor is configured to acquire the analog data based on light quantity data which is acquired through at least two PDs of the four (4) PDs.

19. The electronic device of claim 12, wherein each pixel of the plurality of pixels comprises a single PD and a single FD, and wherein the image sensor is configured to acquire the analog data based on light quantity data which is acquired through the single PD.

20. The electronic device of claim 12, wherein the at least one processor is further configured to, in response to it being determined that a photographing environment of the electronic device corresponds to a designated photographing environment, control the image sensor to provide the first digital data which is acquired by digitally converting the analog data with the first sensitivity two or more times and averaging, and the second digital data which is acquired by digitally converting the analog data with the second sensitivity two or more times and averaging, to the at least one processor.

* * * * *